United States Patent
Schneller et al.

(10) Patent No.: US 9,514,972 B2
(45) Date of Patent: Dec. 6, 2016

(54) FIXTURE DRYING APPARATUS AND METHOD

(75) Inventors: Chris Schneller, Tijeras, NM (US); Scott Roberts, Albuquerque, NM (US); Kathryn Whitaker, Albuquerque, NM (US); Kevin Ferguson, Albuquerque, NM (US); Stephen Islas, Albuquerque, NM (US); Joe Moore, Austin, TX (US); Jim Puissant, Albuquerque, NM (US)

(73) Assignee: AIR PRODUCTS AND CHEMICALS, INC., Allentown, PA (US)

( * ) Notice: Subject to any disclaimer, the term of this patent is extended or adjusted under 35 U.S.C. 154(b) by 720 days.

(21) Appl. No.: 12/474,237

(22) Filed: May 28, 2009

(65) Prior Publication Data

US 2010/0258149 A1    Oct. 14, 2010

Related U.S. Application Data

(60) Provisional application No. 61/056,755, filed on May 28, 2008.

(51) Int. Cl.
*B08B 9/00* (2006.01)
*H01L 21/673* (2006.01)
*H01L 21/67* (2006.01)

(52) U.S. Cl.
CPC ... *H01L 21/67379* (2013.01); *H01L 21/67028* (2013.01); *H01L 21/67051* (2013.01)

(58) Field of Classification Search
USPC .............................. 134/94.1, 95.1, 95.2, 170
See application file for complete search history.

(56) References Cited

U.S. PATENT DOCUMENTS

| | | | |
|---|---|---|---|
| 3,092,120 A | | 6/1963 | Hilger et al. |
| 4,941,489 A | * | 7/1990 | Kamimura et al. ......... 134/95.3 |
| 5,254,205 A | * | 10/1993 | Tsutsumi et al. ............ 156/538 |
| 5,288,333 A | * | 2/1994 | Tanaka et al. .................. 134/31 |
| 5,351,360 A | * | 10/1994 | Suzuki et al. .................. 15/302 |
| 5,896,674 A | * | 4/1999 | Kim et al. ....................... 34/480 |
| 6,017,397 A | * | 1/2000 | Doran .............................. 134/1 |
| 6,039,057 A | * | 3/2000 | Doran ......................... 134/95.2 |
| 6,053,984 A | * | 4/2000 | Petvai et al. ..................... 134/3 |
| 6,096,100 A | * | 8/2000 | Guldi et al. ................. 29/25.01 |
| 6,202,318 B1 | * | 3/2001 | Guldi et al. ...................... 34/79 |
| 6,248,177 B1 | * | 6/2001 | Halbmaier ....................... 134/2 |
| 6,287,178 B1 | * | 9/2001 | Huynh et al. ................... 451/73 |
| 6,861,624 B1 | | 3/2005 | Pelster |
| 7,216,655 B2 | * | 5/2007 | Halbmaier et al. .......... 134/170 |
| 2002/0100495 A1 | * | 8/2002 | Bexten ..................... B08B 3/02 134/18 |
| 2003/0102015 A1 | | 6/2003 | Halbmaier et al. |
| 2003/0201002 A1 | | 10/2003 | Chen et al. |

FOREIGN PATENT DOCUMENTS

| | | |
|---|---|---|
| CN | 1452500 A | 10/2003 |
| JP | 2005-109523 | 4/2005 |
| KR | 20040074315 A | 8/2004 |
| KR | 20060071490 A | 6/2006 |
| KR | 20080029564 A | 9/2006 |
| KR | 20050114875 A | 6/2007 |
| KR | 20070063664 A | 6/2007 |

* cited by examiner

*Primary Examiner* — Michael Barr
*Assistant Examiner* — Benjamin L Osterhout
(74) *Attorney, Agent, or Firm* — Anne B. Kiernan

(57) ABSTRACT

Wafer carrier washing and drying apparatus and method, especially useful for the semiconducting industry.

21 Claims, 39 Drawing Sheets

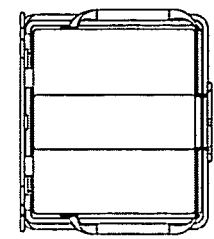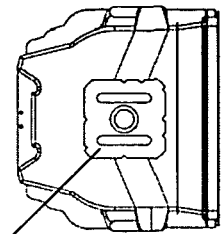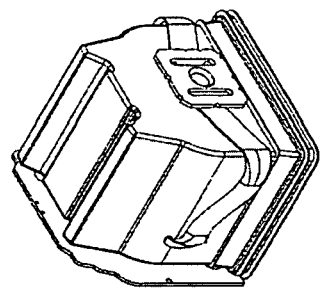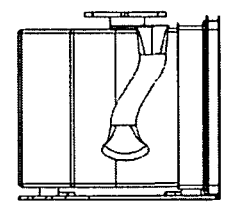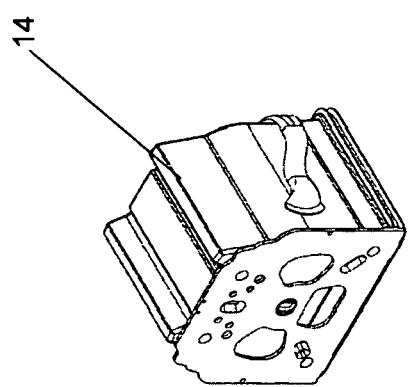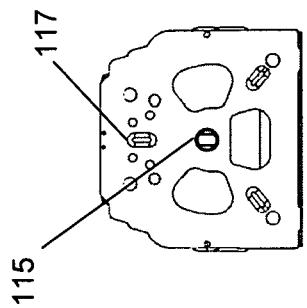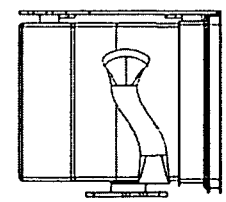

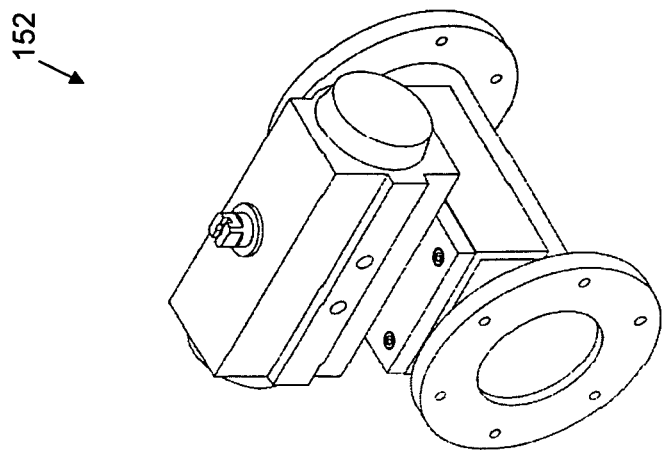
Fig. 21B
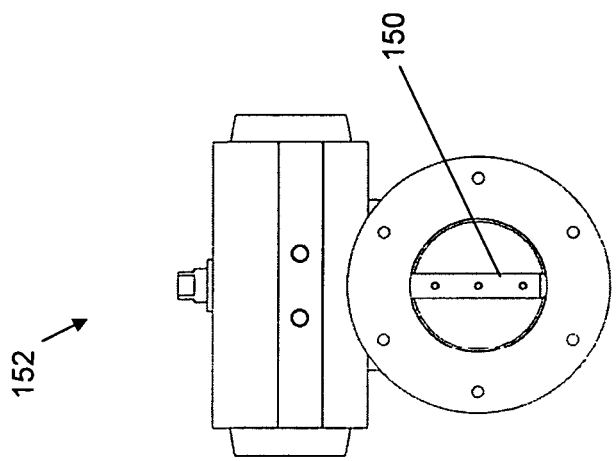
Fig. 21A
Fig. 21

FIXTURE DRYING APPARATUS AND METHOD

CROSS-REFERENCE TO RELATED APPLICATIONS

This application claims priority to and benefit of U.S. Provisional Patent Application Ser. No. 61/056,755, entitled "FIXTURE DRYING PROCEDURE AND APPARATUS", to Christopher Schneller et al., filed on May 28, 2008, and the specification thereof is incorporated herein by reference.

BACKGROUND OF THE INVENTION

Field of the Invention

Technical Field

Embodiments of the present invention relate to an apparatus and method for substantially drying and reducing the drying time after a manufacturing fixture has been washed, preferably a wafer carrier including but not limited to a front opening unified pod (FOUP) fixture. The invention may also be used on manufactured products, tooling fixtures or other elements requiring accelerated drying or removal of fluids.

BRIEF SUMMARY OF THE INVENTION

An embodiment of the present invention relates to an apparatus for washing and drying a carrier which includes a chamber capable of holding a carrier, the chamber having a carrier-exterior spray system and a carrier-interior spray system internal to the chamber, the carrier-exterior spray system having at least one slot which sprays a fluid onto an exterior surface of the carrier, and the interior spray system having at least one slot which sprays fluid into an interior of the carrier. The carrier can be a semi-conductor wafer carrier and/or a the lid of a semi-conductor wafer carrier. The fluid can be a liquid or a gas. The spray systems can move perpendicular to each other to prevent carrier movement. The carrier-exterior and/or carrier-exterior spray system can be at least partially rotatable.

In one embodiment, one or both of the spray systems oscillate in a sweeping motion. In addition, a motor can be provided for rotating the carrier. At least one heating system can also be provided and the heating system can include at least one heating pad. Optionally, the apparatus can be disposed within a mini clean environment. In one embodiment, a plurality of apparatuses can be disposed within a cabinet.

An embodiment of the present invention also relates to a method of washing and drying a carrier which method can include disposing a carrier into a chamber, spraying a liquid on an exterior of the carrier with an exterior spray system, spraying a liquid on an interior of the carrier with an interior spray system, spraying a gas on an exterior of the carrier with the exterior spray system, and spraying a gas on an interior of a carrier with the interior spray system. Optionally, the exterior and interior of the carrier are sprayed in a perpendicular motion to one another. At least one of the spraying steps can include spraying in a sweeping motion.

BRIEF DESCRIPTION OF THE SEVERAL VIEWS OF THE DRAWINGS

The accompanying drawings 1-39, illustrations and depictions which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIGS. 14A-G are drawings illustrating different views of a wafer carrier;

FIGS. 21A-B are views illustrating a butterfly valve;

DETAILED DESCRIPTION OF THE INVENTION

As illustrated in FIGS. 1-21, embodiments of the present invention comprise a fixture washing and drying body apparatus chamber, preferably for washing and drying a wafer carrier type manufacturing fixture. FIGS. 22-35 illustrate lid chamber embodiments of the present invention. FIGS. 36-39 illustrate embodiments of a mini-environment and chamber cabinets.

An embodiment of the present invention relates to an apparatus and method for washing and drying a fixture, especially useful for wafer carriers. Wafer carriers must be cleaned in a super clean environment. Embodiments of the present invention comprise a body chamber assembly and a lid chamber assembly. The wafer carrier apparatus body chamber 10 (FIG. 1) is a chamber for washing and drying the body of a wafer carrier.

The term "chamber" as used throughout the specification and claims includes but is not limited to the meaning "an at least substantially enclosed space."

Figure 1:
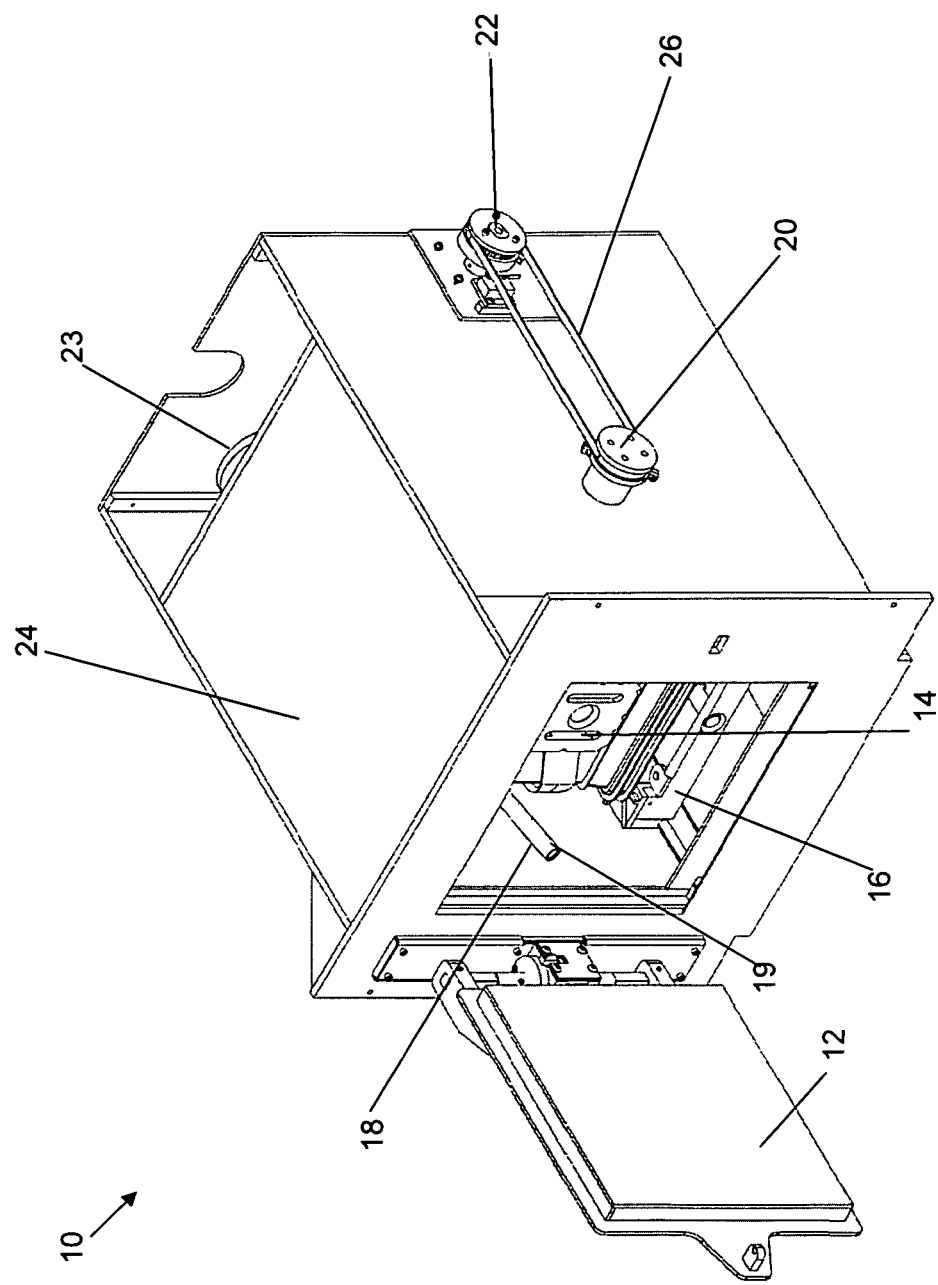
FIG. 1 is a front perspective view illustrating an embodiment of a washing and drying body chamber with a wafer carrier installed.

Embodiments of body chamber 10 (see FIG. 1) can be comprised of Polyvinyldiene fluoride (PVDF) sheets or a similar material, optionally about 25.5 inches deep by about 21 inches wide, and about 26 inches high, although dimensions can vary. In one embodiment, the present invention can be modular and scalable. As illustrated in FIG. 1, body chamber 10 preferably has door 12 and pulley driven drive 22 for movement of exterior spray bar 18 (see also FIG. 12). Body chamber 10 preferably comprises pulley drive 22 connected to spray bar manifold 20 by pulley belt 26. Body chamber 10 also has interior spray bar 54 (FIG. 10) for washing and drying the interior of a wafer carrier that is preferably directly driven. Wafer carrier body 14 preferably sits on frame 16. Corner supports are preferably provided and most preferably are slightly angled to prevent water collection and particle coagulation. All exposed sides of frame 16 can be chamfered at the top to prevent water collection and particle coagulation as well. Exterior spray bar 18 preferably contains holes and/or slots 19 that are positioned along the sides of the pipe facing wafer carrier body 14 and chamber 10 walls. Although slots 19 can be created through any manner know to those skilled in the art, slots 14 are most preferably created using a laser and act as water nozzles during the wash cycle and as fanning air nozzles during the air knife and dry cycles. Interior spray bar 54 preferably comprises holes and two fanning water nozzles that cover the interior of the wafer carrier 14 body. Body chamber 10, exterior spray bar 18 and interior spray bar 54 preferably use water to work and sweep out particles with slots 19 and then purge and/or dry with air or compressed gas, which blow off droplets of water. Body chamber 10 preferably comprises panels 24 and butterfly valve 23, although other valve types can of course be used in place of butterfly valve 23. Body chamber 10 is preferably constructed with vent points to ensure a slight positive pressure during operation.

Figure 2:
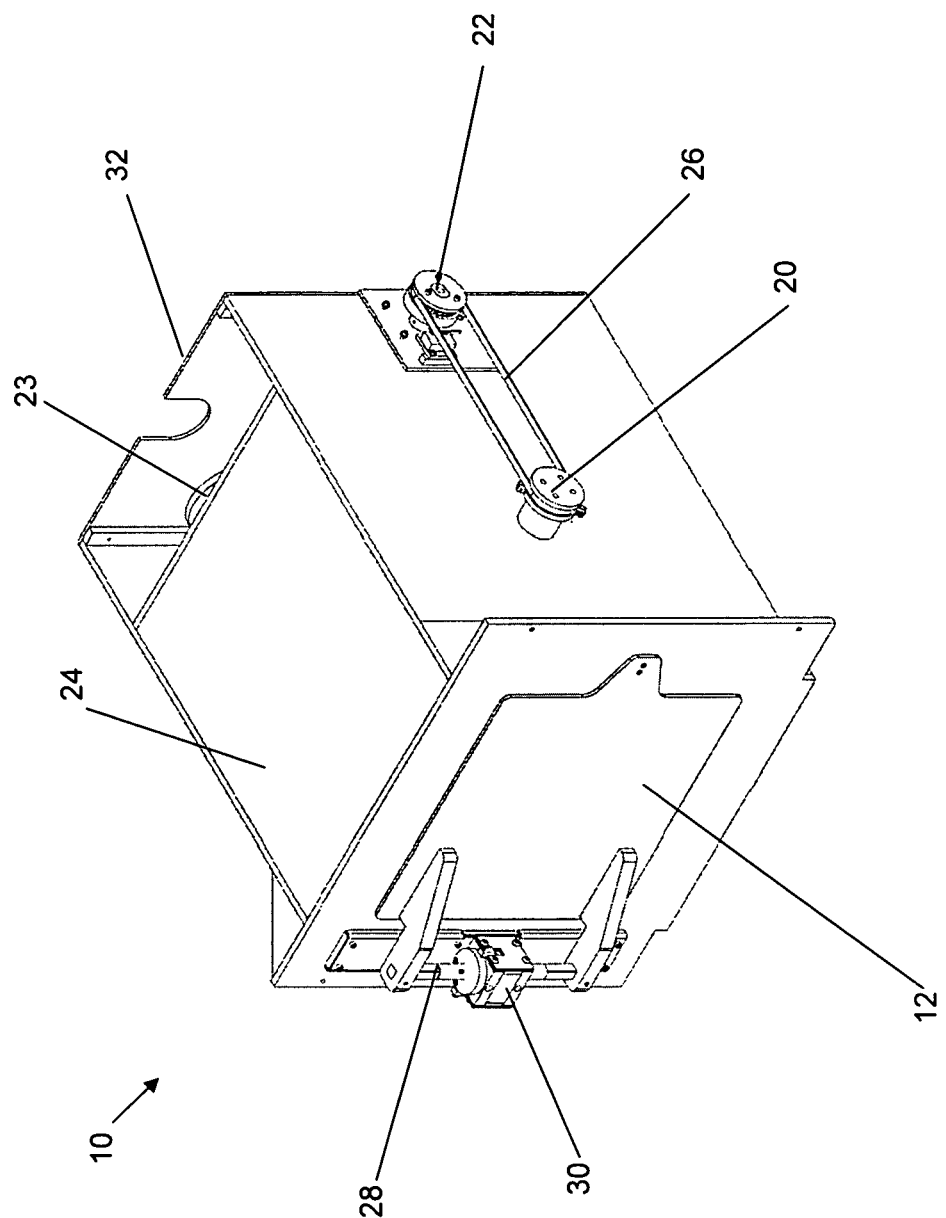
FIG. 2 is a front perspective view illustrating the FIG. 1 embodiment with door closed.

In the embodiment illustrated FIG. 2, pulley drive 22 connects to exterior spray bar manifold 20 which also contains the inlet connections for the air and water. This embodiment aids in the prevention of misalignment of the spray bar due to pressure changes and expansion and contraction of the piping material (which can be made of but is not limited to PVDF). Butterfly exhaust valve 23 preferably controls the pressure inside chamber 10. During the wash cycle it is not as important to have a large pressure relief as it is during the air knife cycle due to the high pressure and volume of air. Butterfly valve 23 is optionally actuated via air to open then the pressure is released to close. As also illustrated in an embodiment in FIGS. 21A-B, the design of the diaphragm allows for a minimal amount of exhaust to be pulled when closed. Embodiments of the present invention include in-line monitoring of particles to ensure cleanliness.

FIG. 2 illustrates an embodiment of body chamber 10 with front door 12 closed. Pulley drive 22 is connected by belt 26 to exterior spray bar manifold 20. Door 12 has hinge 28 and chamber pressure lock 30. Panels 24 are most preferably used to form top, bottom and sides of chamber 10.

Figure 3:
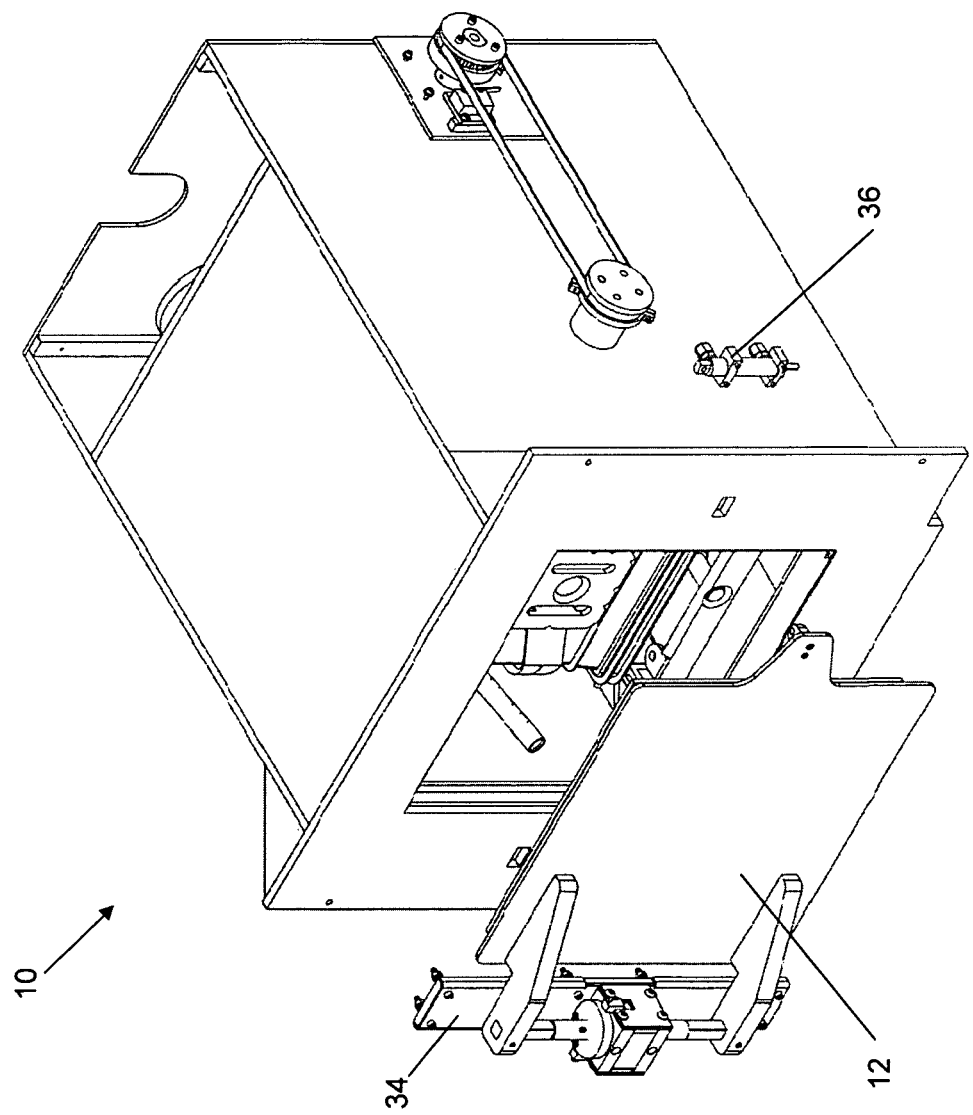
FIG. 3 is a perspective view illustrating the FIG. 1 embodiment with door removed.
Figure 4:
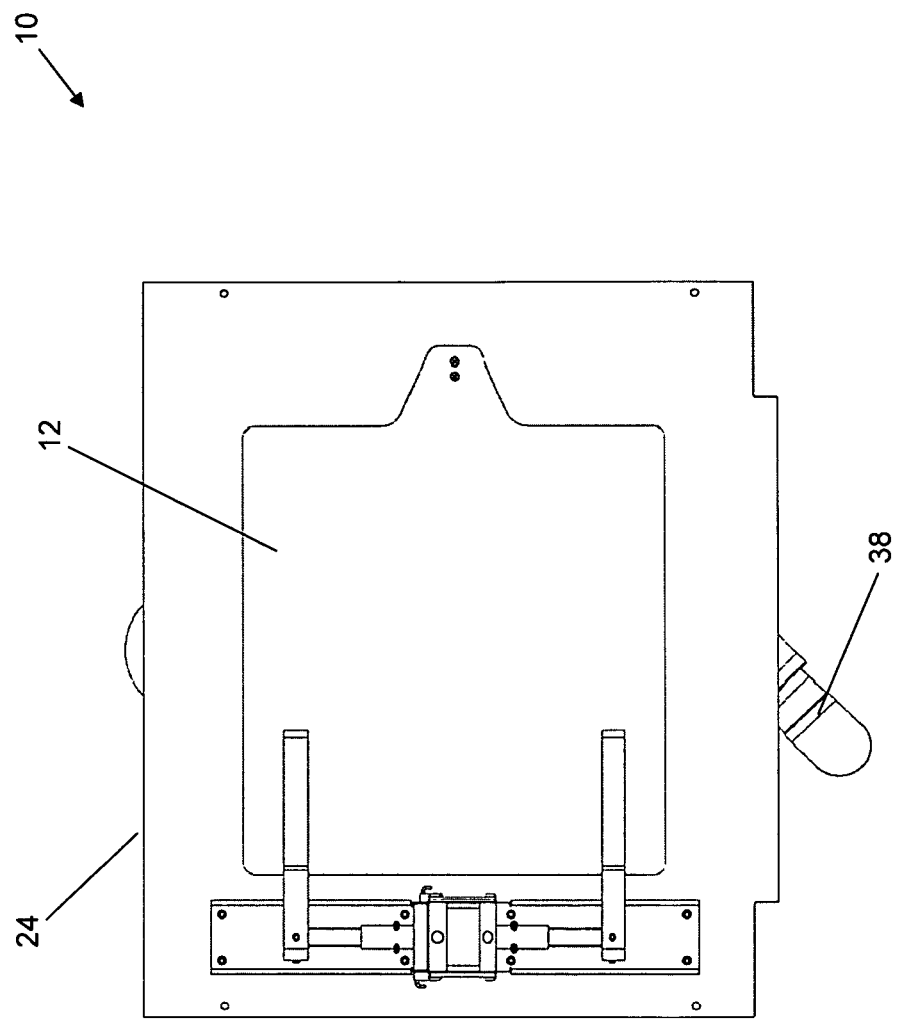
FIG. 4 is a front view illustrating the FIG. 1 embodiment with the door closed.
Figure 5:
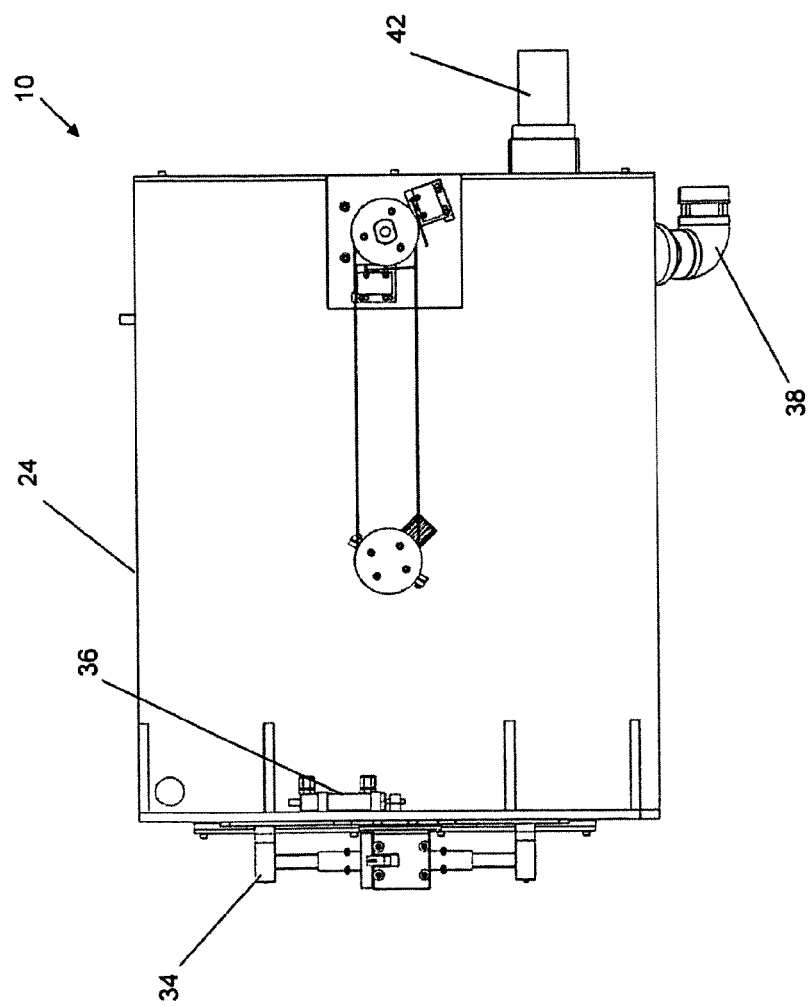
FIG. 5 is a side view illustrating the FIG. 1 embodiment.
Figure 6:
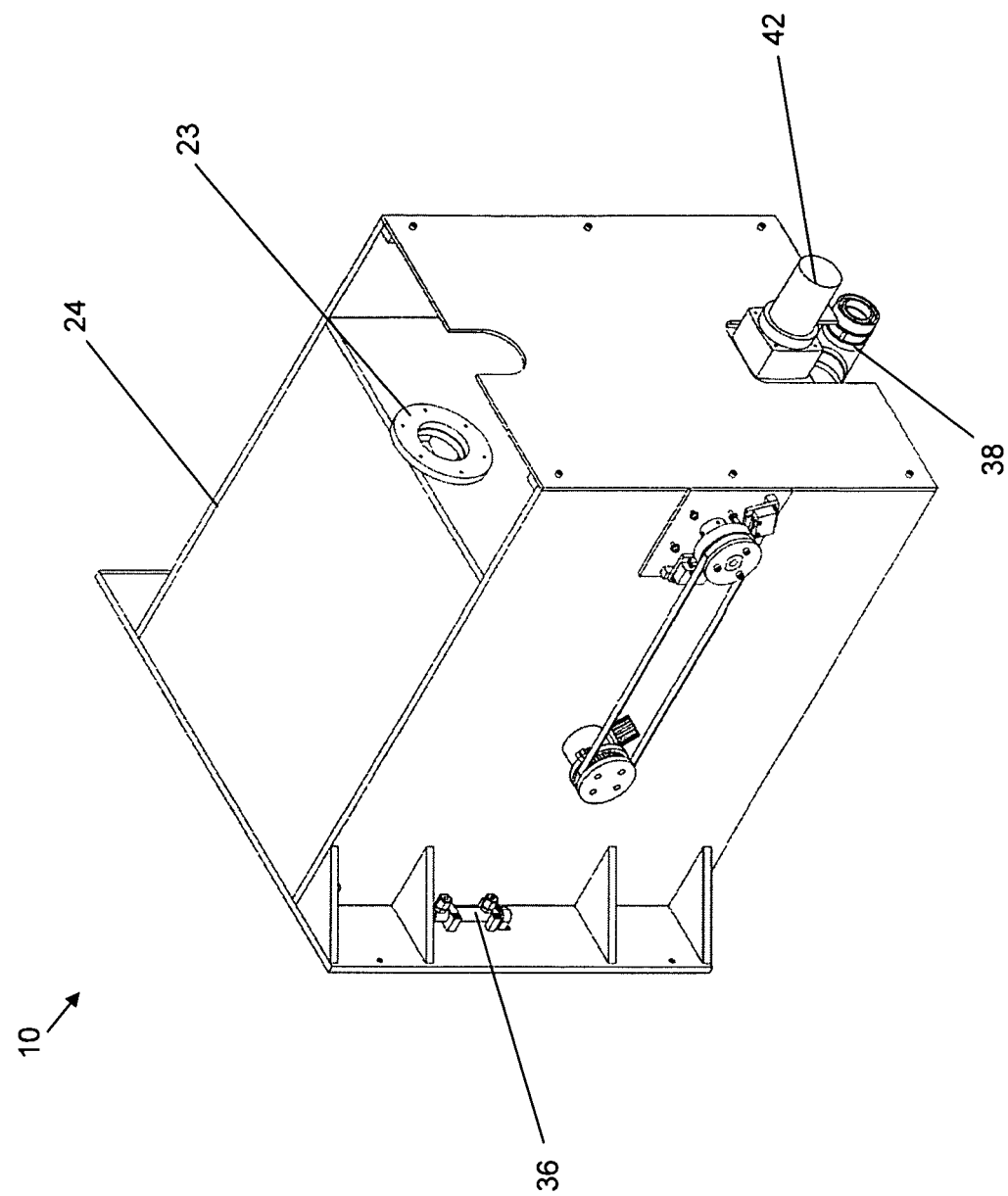
FIG. 6 is a back perspective view illustrating the FIG. 1 embodiment.
Figure 7:
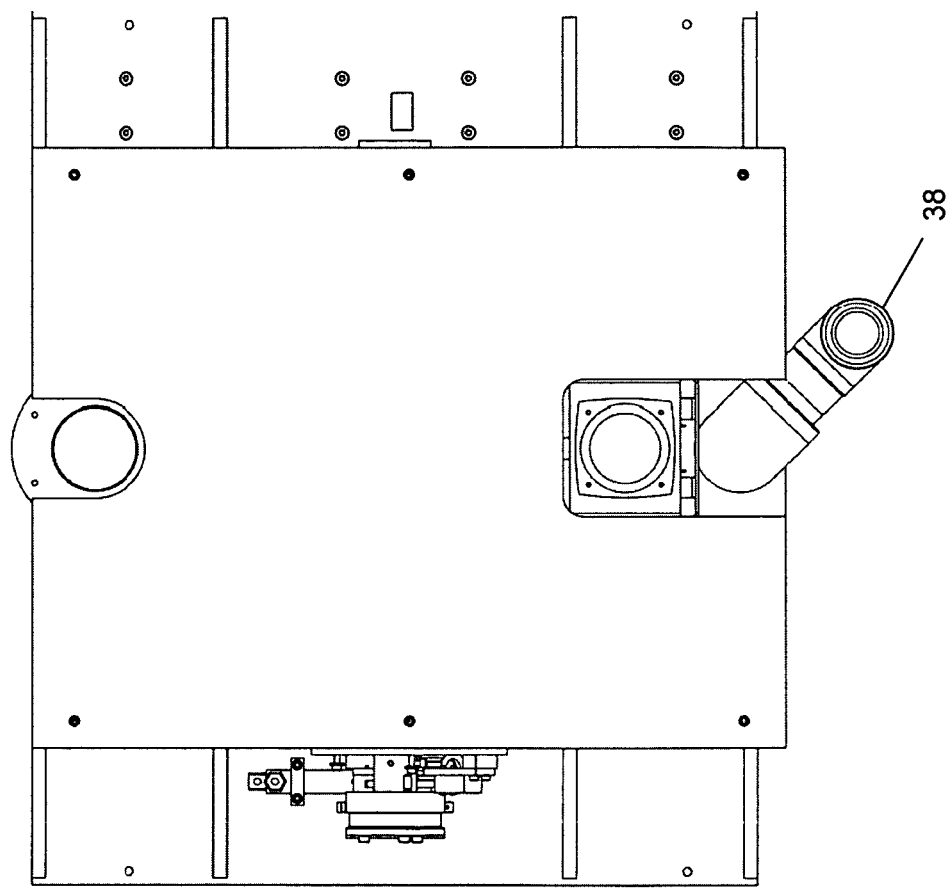
FIG. 7 is a rear view illustrating an embodiment of the present invention.

FIG. 3 illustrates a partially exploded view of body chamber 10. Exterior spray bar 18 preferably comprises numerous parts all preferably made of PVDF and/or Teflon and the like. Body chamber 10 comprises door 12. Door 12 preferably has a plurality of components including but not limited to door assembly 34, and FIG. 3 also shows door lock assembly 36. Fluid spray, which in one embodiment is preferably water, is preferably heated to between approximately 130° F. to approximately 150° F. coming out of the spray slots 19 (see FIG. 1) and cools slightly upon spraying. Fluid is passed through a rotary joint and is most preferably super clean and purified by filtering. O rings and rotary joint are preferably designed and constructed with materials which will not contaminate fluid.

Figure 8:
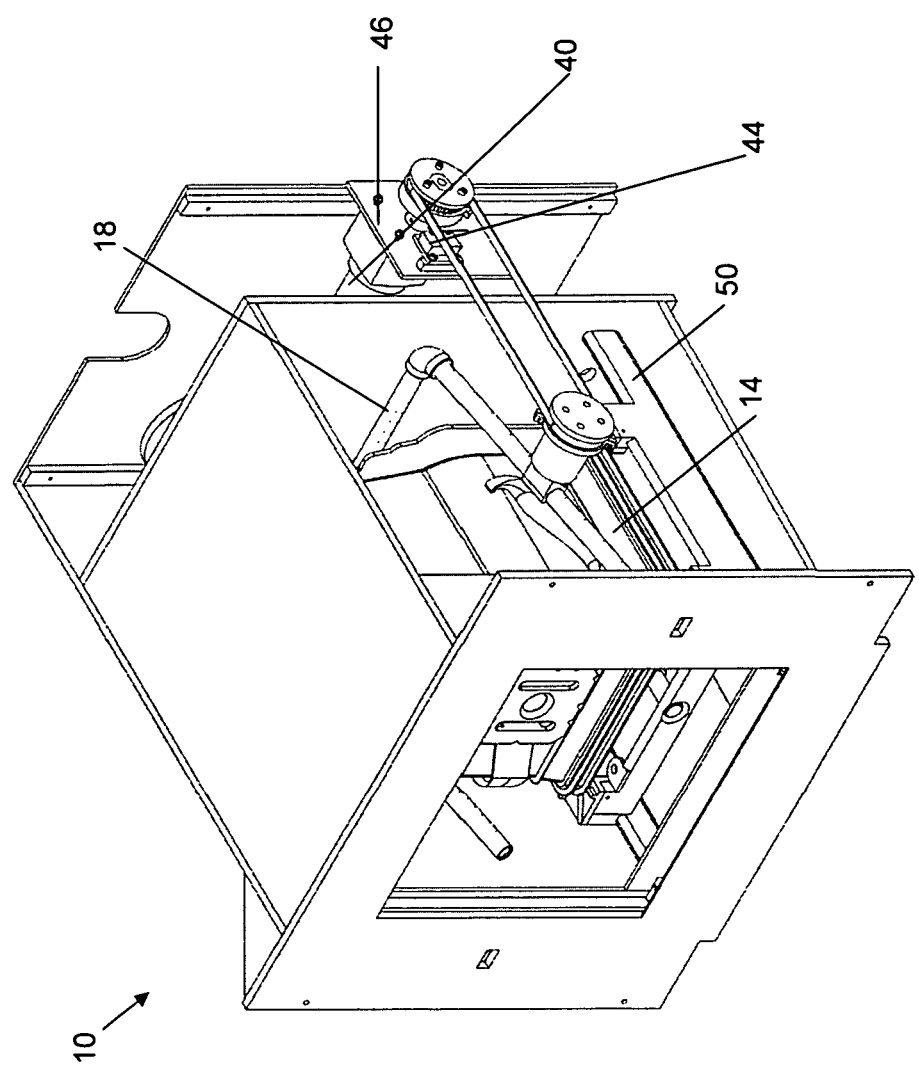
FIG. 8 is a perspective view illustrating an embodiment of a body chamber without side panel.

FIGS. 4-7 illustrate different perspectives of an embodiment of the present invention. In one embodiment, body chamber 10 preferably comprises: door 12; panels 24; water inlet piping 38; door lock 36; door assembly 34; air inlet piping 42; and butterfly valve 23. Water piping 38 optionally has a pea trap to prevent the backflow of contaminants. FIG. 8 illustrates an embodiment without a side panel. Manifold 40 preferably connects pulley drive 22, water and air inlets 38 and 42, and spray bar 18 together. Three large holes 122 (see FIGS. 17 A and B) preferably allow for air and water to flow into exterior spray bar 18 without creating pressure from the rotation. Holding brackets 124 are preferably welded or otherwise fixedly secured to the pipe and prevent interference of the slots so that there is full contact of air and water to carrier body 14. The driving side of pulley drive 22 preferably utilizes limit switches 44 (and also 80, FIG. 12) to prevent exterior spray bar 18 from over rotating and damaging the pipe. Exterior spray bar 18 preferably rotates approximately 2700 from back to front and front to back in a sweeping motion. Alternatively, exterior spray bar 19 may be stationary or oscillate.

FIG. 8 illustrates a perspective view of body chamber 10. Manifold drive 40 and switching manifold 46 preferably assist in controlling the flow of fluid to the system. Body chamber 10 also comprises chamber frame 50.

Figure 9:
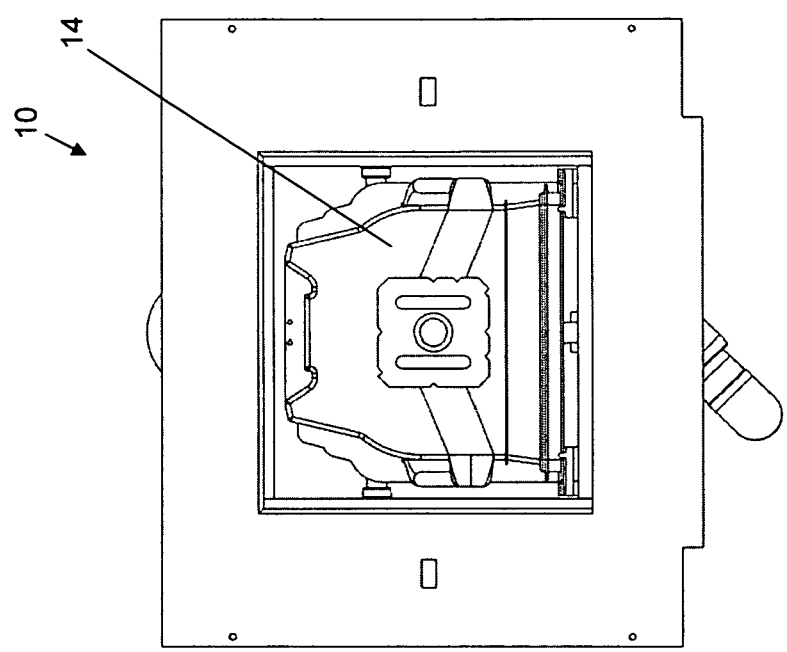
FIG. 9 is a front view illustrating a front face of a wafer carrier in an embodiment of the present invention.
Figure 10:
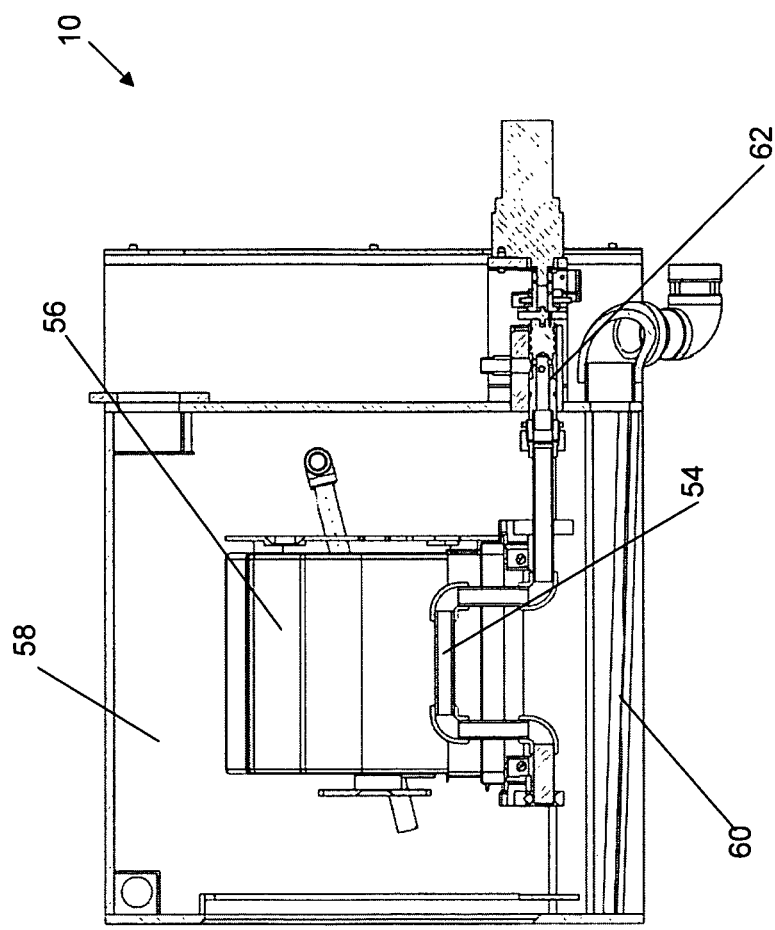
FIG. 10 is a cross-sectional side view illustrating an interior spray system according to an embodiment of the present invention.

FIG. 9 illustrates chamber 10 with wafer carrier 14 inside. FIG. 10 illustrates a cross section, side view where body chamber 10 comprises carrier 56, interior panel 58, interior spray bar 54, air inlet 62 and water piping 60.

Figure 11:
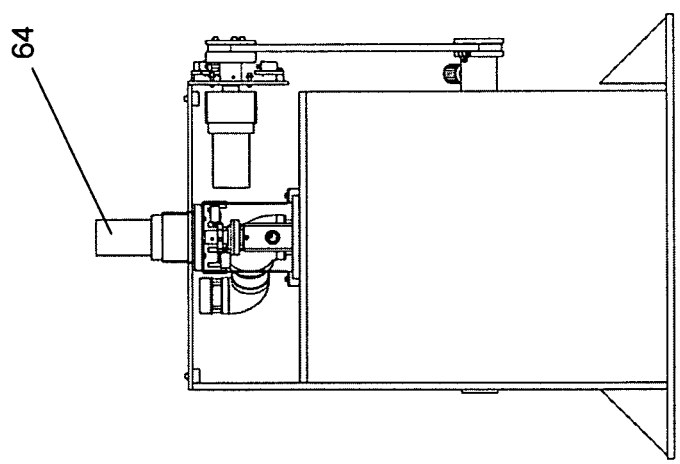
FIG. 11 is a top view illustrating an embodiment of the present invention.
Figure 12:
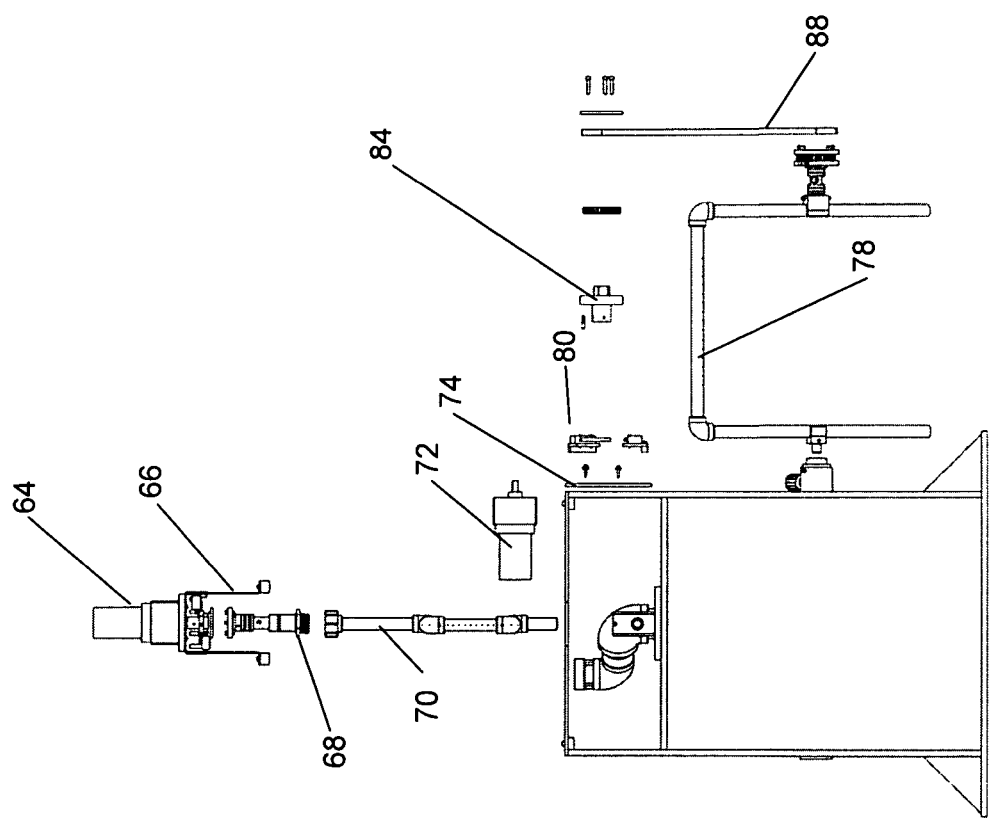
FIG. 12 is an exploded view illustrating components of an embodiment of the present invention.

FIGS. 11 and 12 illustrate a top view of an embodiment of a body chamber. Air inlet 64 (FIG. 11) and exploded view with stabilizer 66, piping connector 68 and piping 70, drive 72, plate 74, switch 80, piston 84, pulley belt 88, and exterior spray bar 78.

Figure 13:
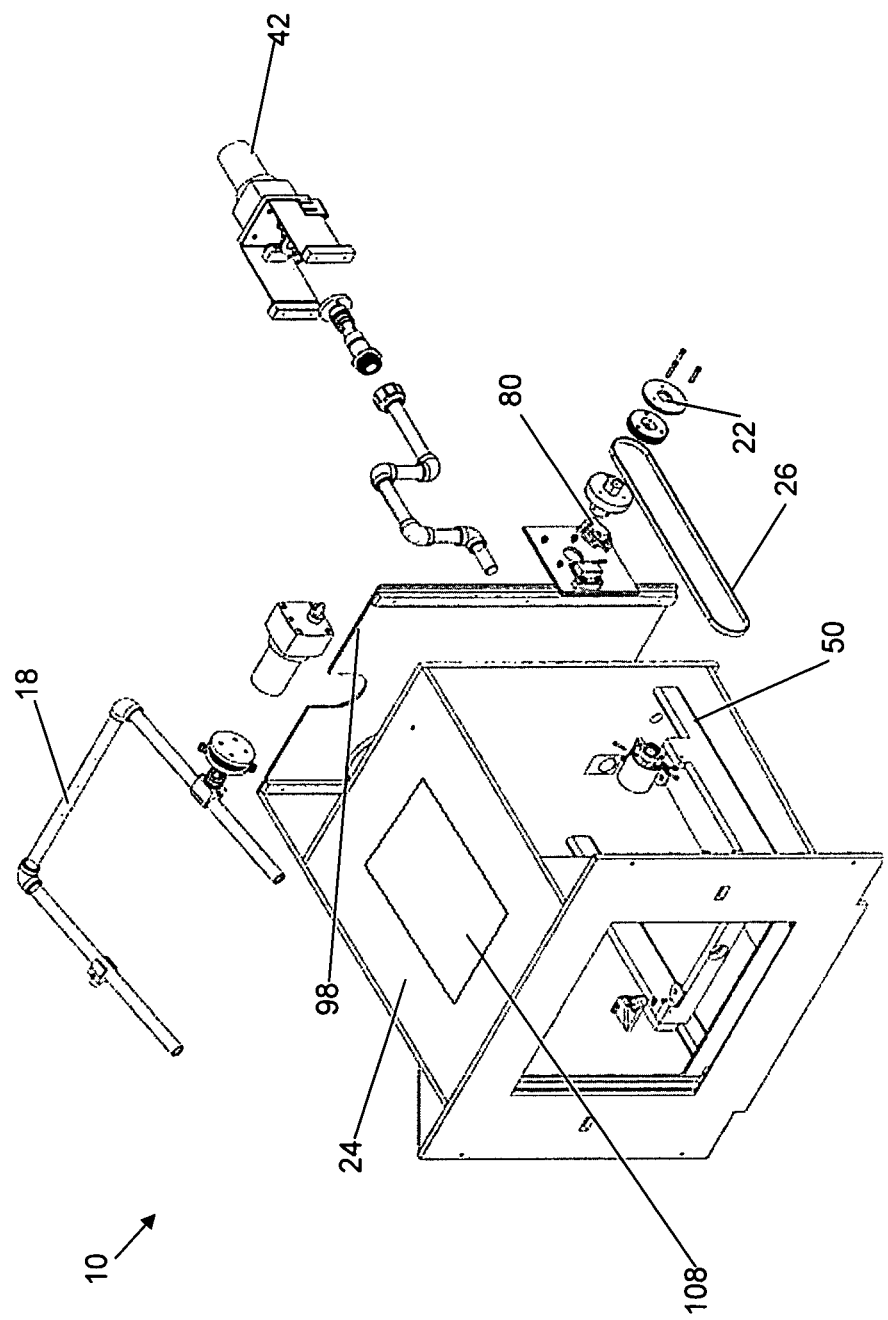
FIG. 13 is an exploded perspective view illustrating components of an embodiment of the present invention.
Figure 15:
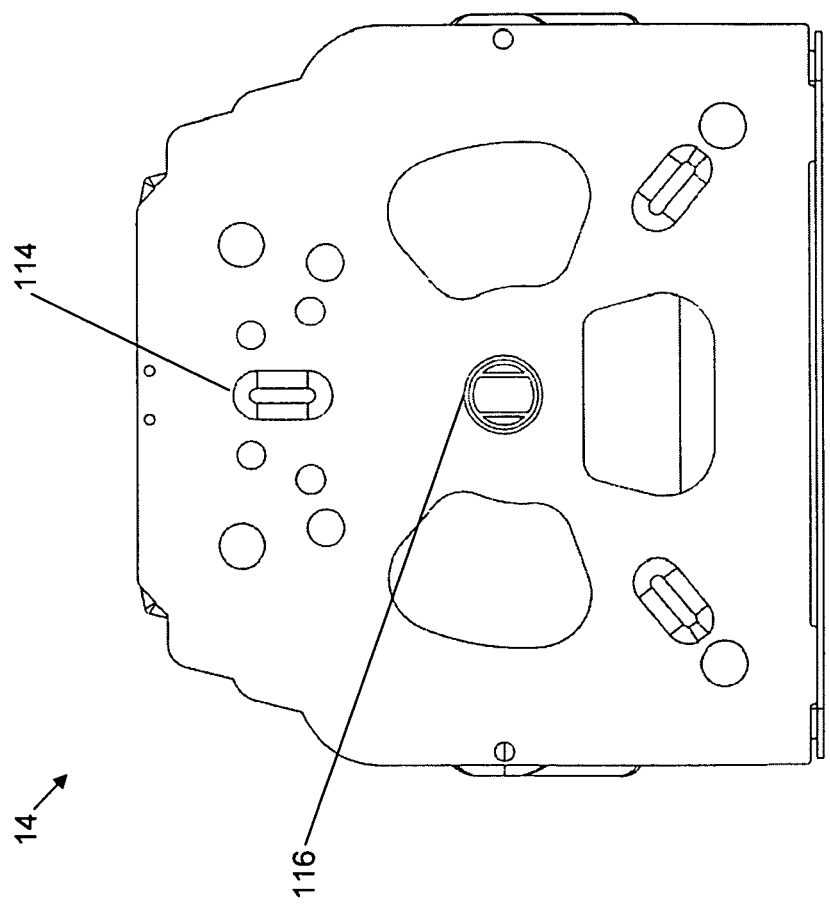
FIG. 15 is an underside view of a wafer carrier.
Figure 16:
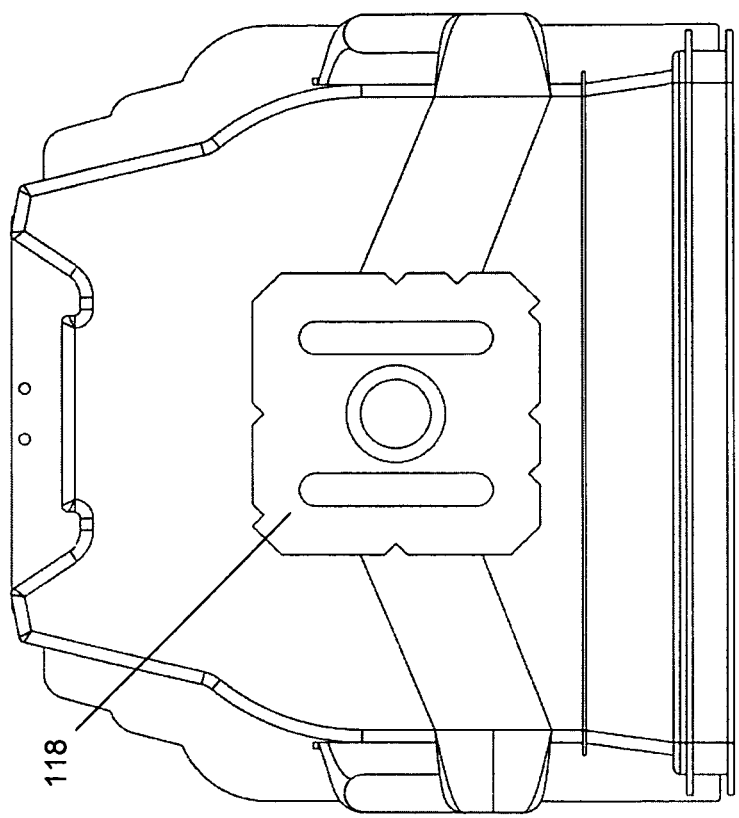
FIG. 16 is a top view illustrating a wafer carrier.
Figure 17:
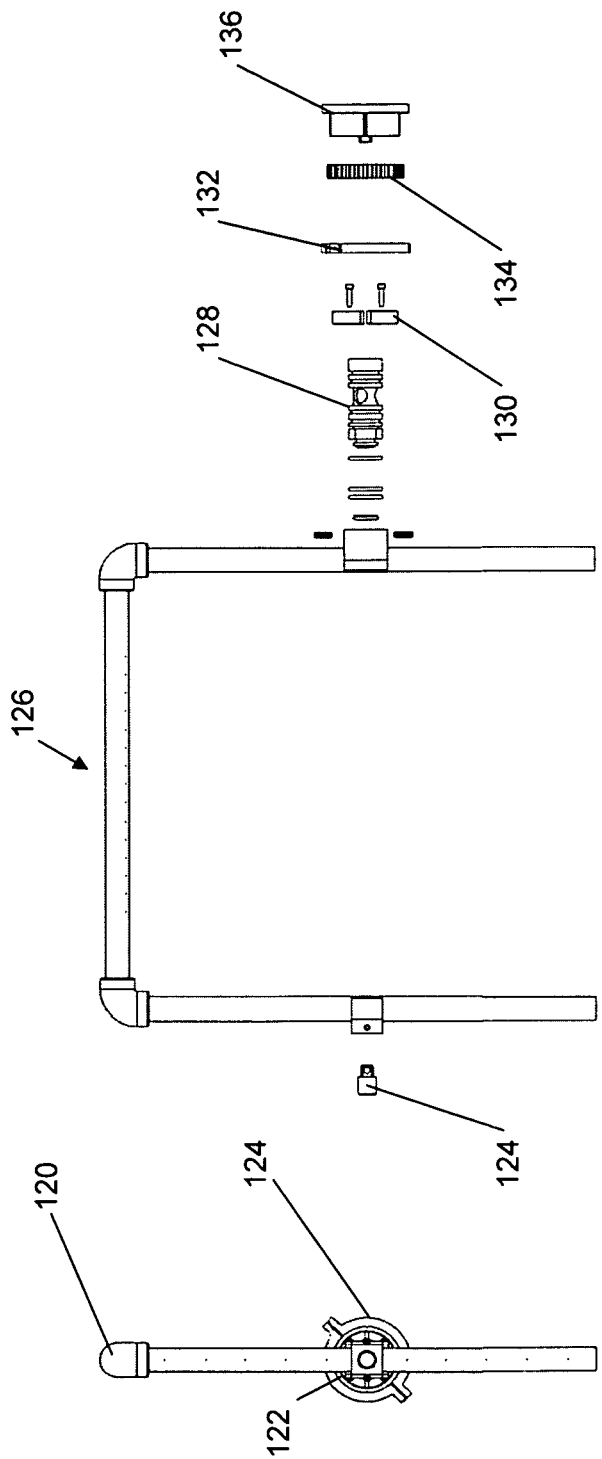
FIGS. 17A and B are respectively front and exploded views of an air knife assembly.

FIG. 13 illustrates an exploded view of body chamber 10 and back portion 98 separated. FIG. 13 also illustrates heating blankets 108. Heating blankets 108 preferably heat the walls of the chamber. Embodiments of the present invention optionally can use one and/or a plurality of heating blankets to heat PVDF panels 24 of chamber 10. Panels 24 absorb and radiate heat into chamber 10. Alternative embodiments include but are not limited to use of other heat transmitting materials for panels and/or for sandwiching heating elements within walls and or any combination thereof. Heating blankets 108 are optionally used for target heating and/or surrounding chamber or any combination thereof. Chamber 10 is preferably not cooled between washing and drying cycle to increase efficiency of cleaning process.

FIGS. 14A-G and 15 illustrate a wafer carrier which can be used in conjuction with embodiments of the present invention. Industry standards dictate the size of wafer carrier 14 but depending on the manufacturer there are differences in the design and intricacy. Many wafer carriers are single, injection molded containers comprised of a poly-carbonate that have additions welded onto the interior and exterior (see FIGS. 14A-G). There are at least three distinct additions/characteristics of a wafer carrier: the robotic flange (FIG. 14G), the wafer combs, and the kinematic flange (FIG. 14E). The robotic flange (FIG. 14G) is what the robotic transportation and tools can use to maneuver the wafer carriers from place to place. Wafer combs space the wafers in the container to prevent damage during transportation, a typical wafer carrier can house 25 wafers. A kinematic flange (FIG. 14E and FIG. 15) is used as a base to stabilize the wafer carrier. A kinematic flange holds the information pertaining to a wafer carrier's capabilities and manufacturing as well as locking manifold 118 (FIG. 14G).

Figure 18:
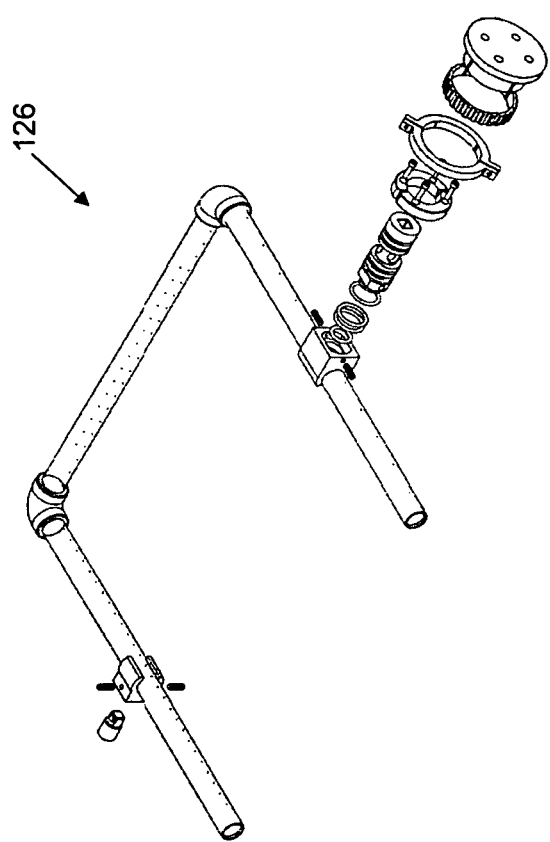
FIG. 18 is a partially-exploded view of an air knife assembly.

FIGS. 17B and 18 illustrate exploded views of exterior spray bar 126 that is also used as an air knife during a drying process. Manifold 128 preferably connects pulley drive 130, 132, 134, and 136. Three large holes 122 preferably allow for air flow and brackets 124 prevent interference of slots for full water contact.

Figure 19:
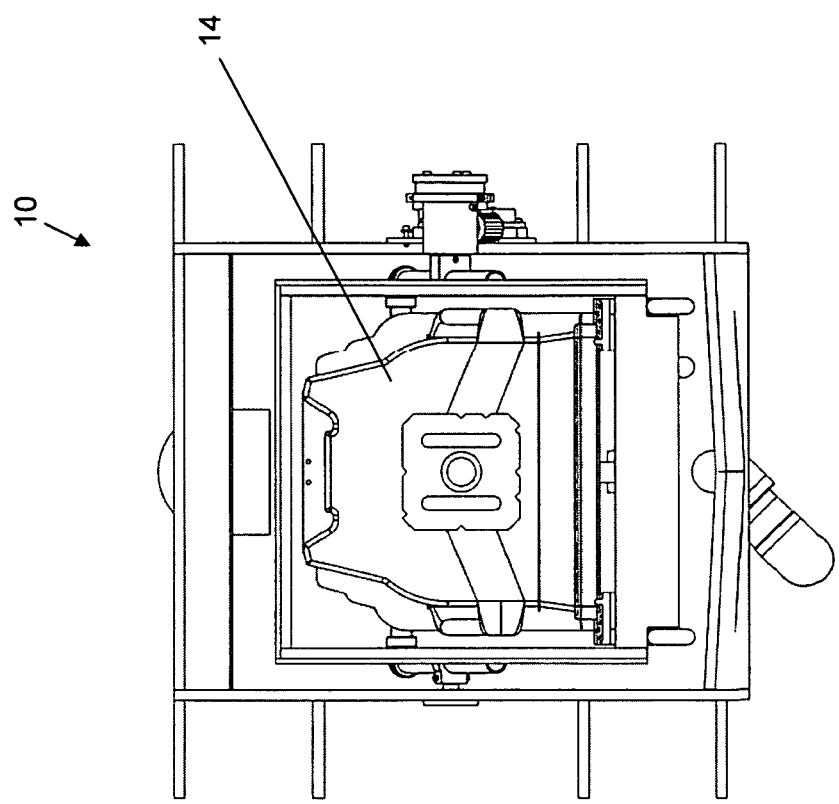
FIG. 19 is a front view illustrating the FIG. 1 embodiment without the front door.
Figure 20:
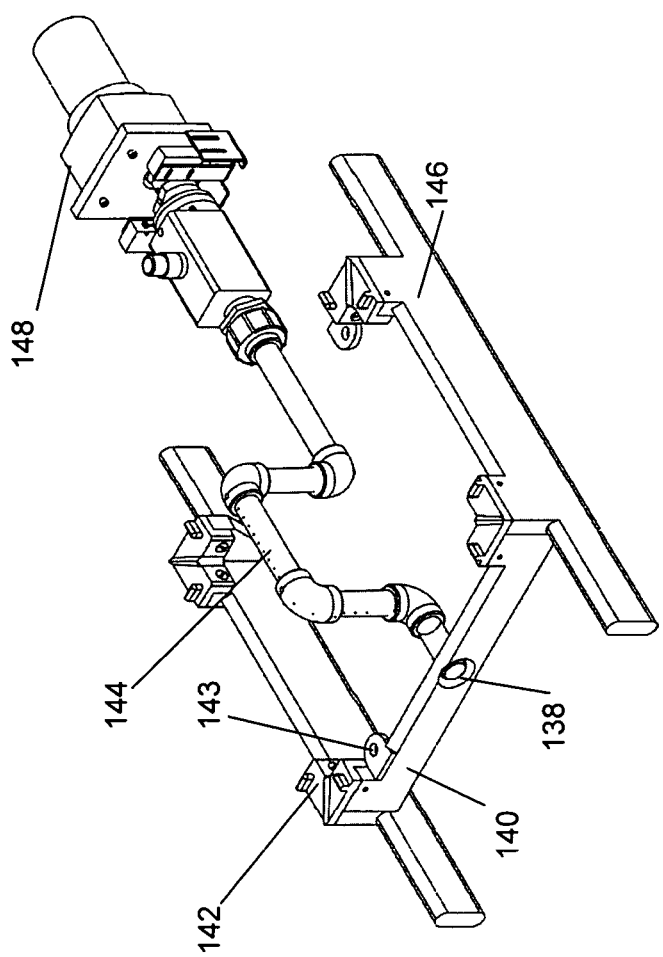
FIG. 20 is a view of a base frame.

FIG. 19 illustrates a front view of body chamber 10 with carrier 14 inside.

Body chamber interior spray bar 144 (FIG. 20) is preferably a direct drive that also preferably uses limit switches. Interior spray bar 144 is preferably a simple fusion welded pipe and elbows that are drilled with the smaller hole sizes on the top and larger hole sizes on the sides. Spray bar 144 preferably freely rotates in hole 138 in front skirt 140 of base frame 146. Interior spray bar 144 preferably rotates in a sweeping motion at approximately 180° from side to side. The two different sweeping motions are preferably used so that the wafer carrier is not pushed one way or the other, which can damage the edges if done forcefully. Movement by a wafer carrier body is also preferably prevented with the use of corner supports 142, in which tabs on both sides keep the wafer carrier in position. Capacitive sensors 143 are optionally implemented to aid in the detection of movement. Sensors 143 can be extremely close but not touching a carrier to detect if the carrier becomes displaced from corner supports 142. If this happens damage can occur not only to the wafer carrier body but also to the interior and exterior spray bars.

FIGS. 21A-B illustrate a side and front view of butterfly valve 150 which preferably acts as a pressure valve.

In order to have the wafer carrier bodies dry within the allotted time, it is preferable to keep chamber 10 warm. In one embodiment, wafer carriers 14 preferably have a coating on the poly-carbonate that aids in the prevention of damage to the carrier during transportation and which coating cannot be heated above 60° C. (140° F.) otherwise warping may occur. Therefore, to maintain the heat needed at a reasonable temperature heating blankets 108 (see FIG. 13) are optionally added to the exterior of the chamber. Blankets 108 are preferably set at about 180° F. and heat chamber 10 to approximately 160° F. An infrared sensor on the side of chamber 10 can be provided which monitors the temperature of wafer carrier 14 closest to the top where the carrier can become the hottest. The heating of chamber 10 becomes critical after the wash cycle during the purge and air knife cycle where the temperature of wafer carrier 14 and chamber 10 drops drastically. Spray of fluid from both spray bars is preferably bidirectional. Therefore, by having the dry cycle also heated it returns to the desired interior temperature of the chamber which maintains the allotted process time. In an embodiment of the present invention, a preferred method and timing for cleaning the wafer carrier bodies is:

1. Body chamber door opens (T=0)
2. Robot places wafer carrier body onto frame (T=40 seconds)
3. Body chamber door closes and locks (T=60 seconds)
4. Wash cycle (T=61 seconds)
5. Purge cycle (T=121 seconds)
6. Air Knife cycle (T=131 seconds)
7. Heated CDA Dry cycle (T=371 seconds)
8. Spray bars return to home position (T=731 seconds)
9. Body chamber door opens (T=732 seconds)

From load port to load port, the total process time including cleaning process is between approximately 10 minutes and approximately 21 minutes, more preferably between approximately 10 minutes and approximately 17 minutes and most preferably between approximately 12 minutes and approximately 14 minutes with a cleaning process time of approximately 12 minutes. With this process cycle, an optimum output of about 21 wafer carriers per hour at start up and about 25 wafer carriers per hour continuously can be met. Embodiments of the present invention are preferably modular and scalable and can fit any operation. Alternatively outputs can vary depending on situational needs.

During the wash and dry cycles, lid 158 (see FIG. 22) is spun at different speeds and directions. Due to the intricacy of lid 158, washing and drying preferably uses spinning manipulations to reach all areas of the fixture. Throughout the wash cycle lid 158 is preferably spun slowly to allow water to enter the door and wash out any particles that have become trapped. In one embodiment, during the dry cycle the door is preferably spun clockwise (CW) for five minutes and counter-clockwise (CCW) for the remainder of the dry cycle at approximately 300 rotations per minute (RPM). The spinning of lid 158 at high speeds aids in expelling the droplets of water that can become trapped inside the door during the wash cycle. In one embodiment, the motor used preferably has the ability to slow down but not stop in the proper home position. Therefore, there is a stopping device can be actuated by air to lock the motor into the correct home position.

During the drying cycle, compressed gas, most preferably air, can be aimed or directed upon and within the fixture, as interior access allows, encouraging removal of residual washing fluid. The compressed gas is optionally heated and aimed or directed through at least one cyclic rotating distribution pipe, tube, manifold or other gas distribution member known in the art. Portions of the distribution system for the compressed air may alternatively oscillate rather than rotate.

Figure 22:
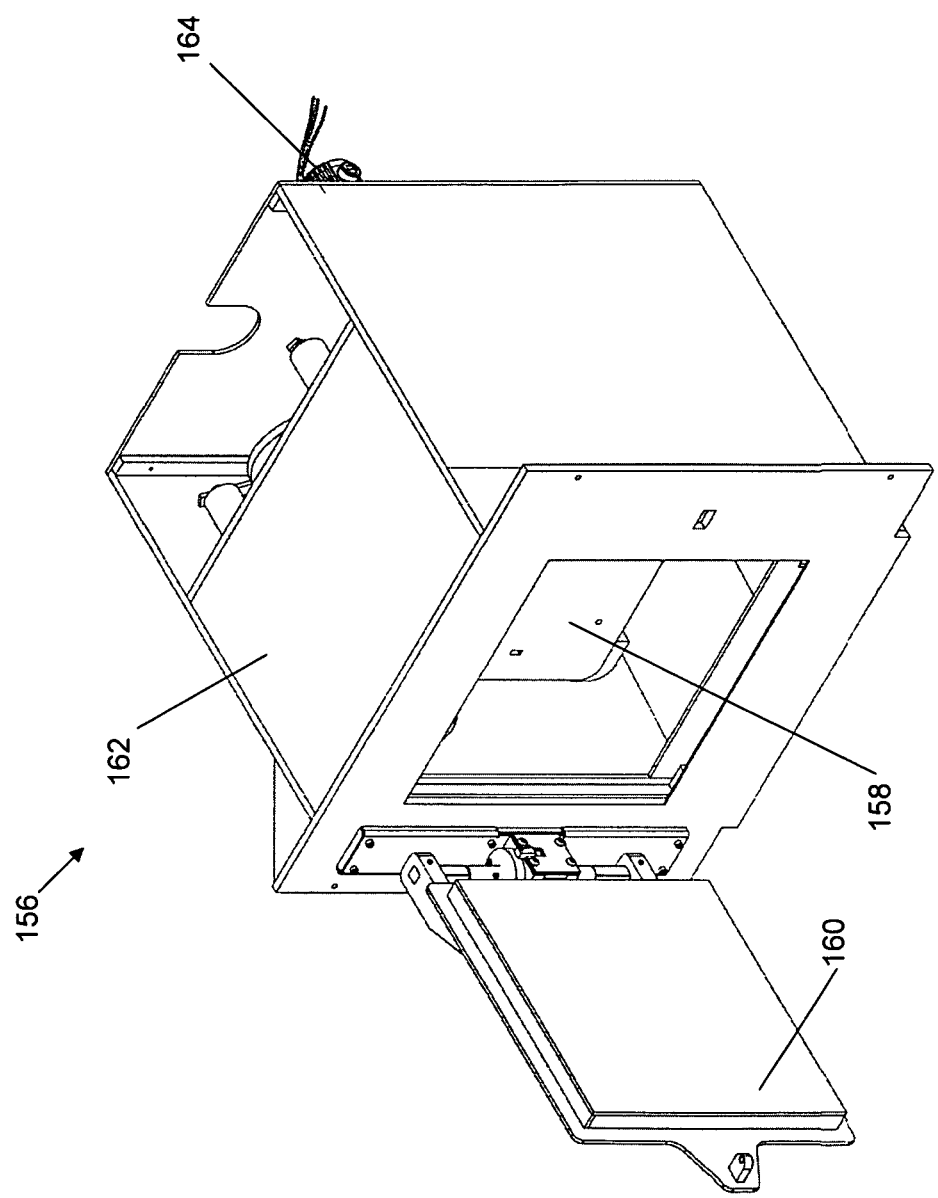
FIG. 22 is a perspective front view of a lid chamber according to an embodiment of the present invention.
Figure 23:
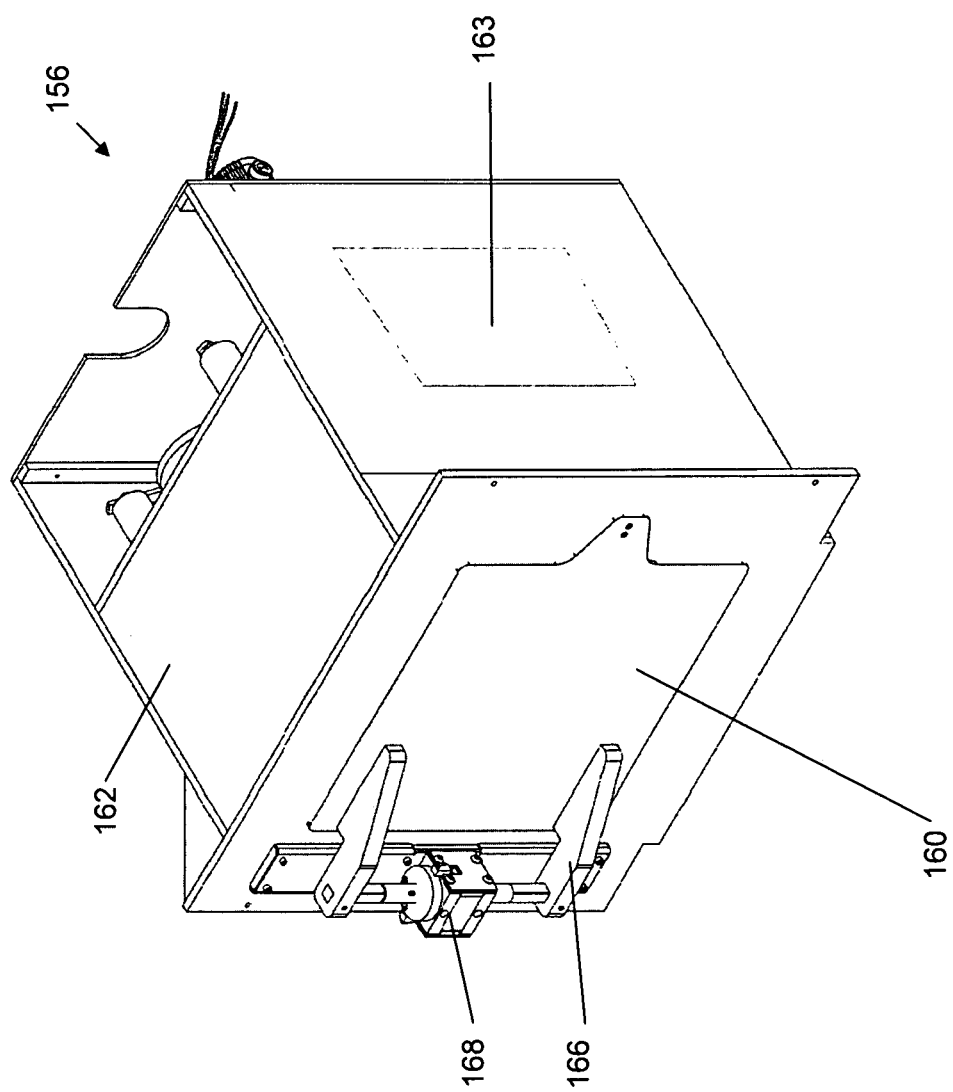
FIG. 23 is a perspective front view of the FIG. 22 embodiment with door closed.

FIGS. 22-23 illustrate embodiments of lid chamber 156. Lid 158 may have a complicated interior design with an intricate locking mechanism and wafer combs that separate and support the individual wafers during transportation. On the front of lid 158 there are two holes that are used for guiding the robot endifector to the key holes (see FIGS. 15 and 16). To ensure that lid 158 is secured tightly on wafer carrier 14 there is a gasket on the interior. Embodiments of lid chamber 156 can have similar structure to a body chamber applied to the lid chamber 156.

FIG. 22 illustrates lid chamber 156 with door 160, wafer carrier lid 158, panels 162, air and water inlet 164, and FIG. 23 also illustrates door bolt 168 and door hinge 166. Cleaning lid 158 includes but is not limited to injecting air into holes (described above) and through openings. FIG. 23 illustrates heating blankets 163.

Figure 24:
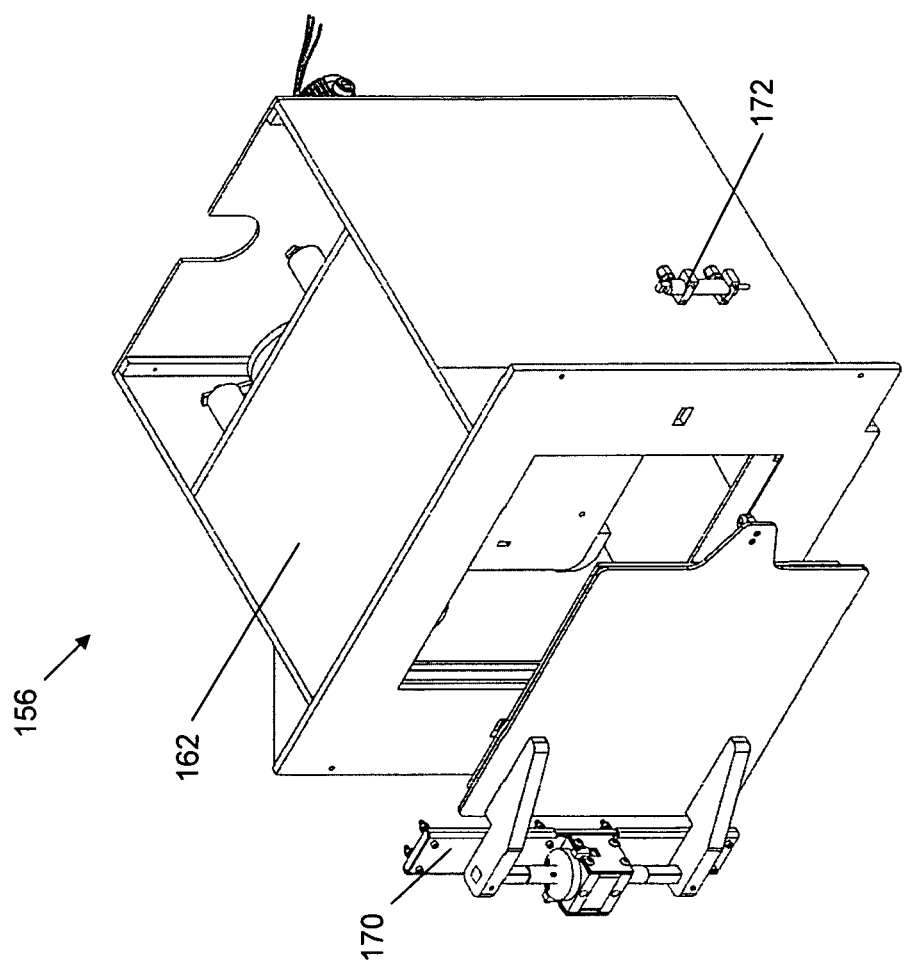
FIG. 24 is a perspective view drawing illustrating the FIG. 22 embodiment with the door exploded from the chamber.
Figure 25:
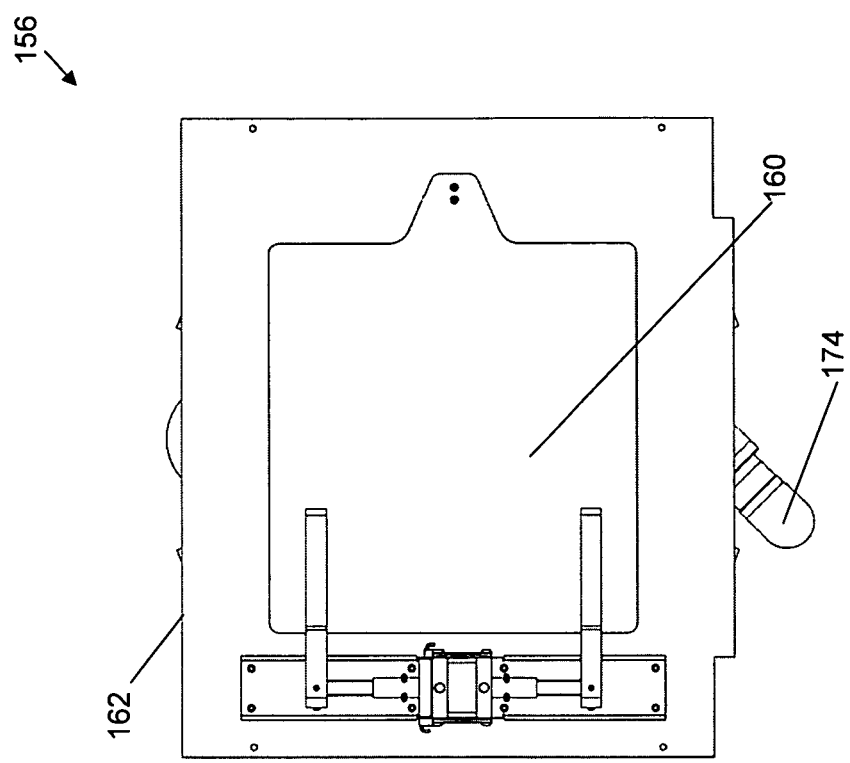
FIG. 25 is a front view illustrating the FIG. 22 embodiment with door closed.

FIG. 24 illustrates lid chamber 156 with door assembly 170 and door lock 172. FIG. 25 illustrates a front view of an embodiment of lid chambers 156 and water inlet 174.

Figure 26:
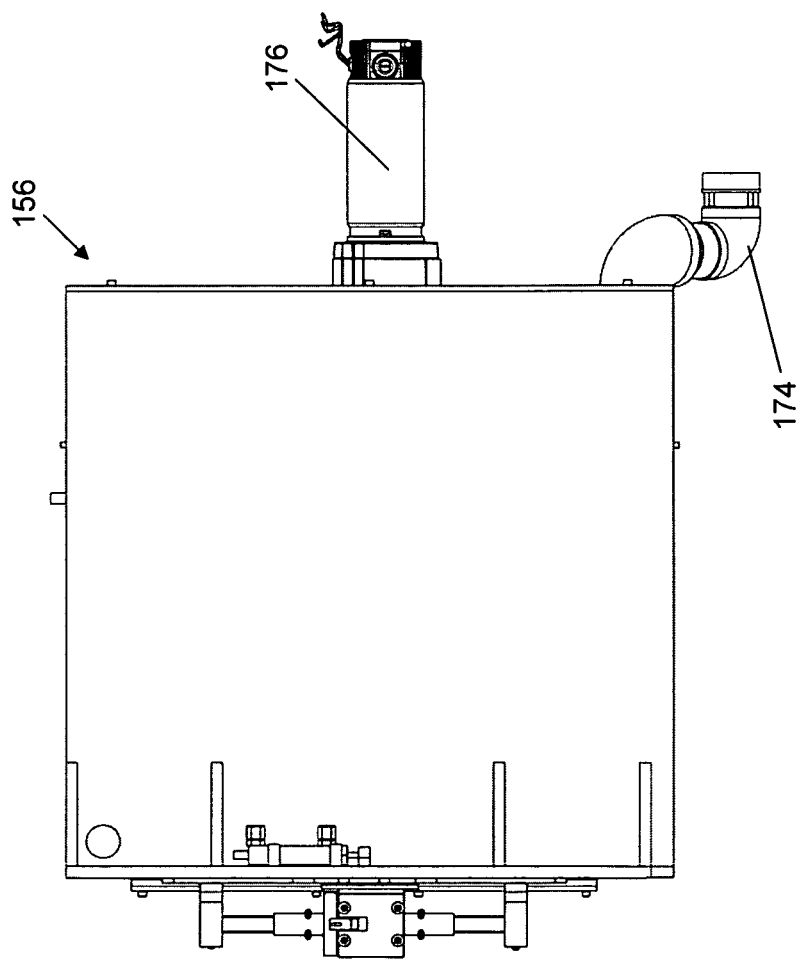
FIG. 26 is a side view illustrating the FIG. 22 embodiment.
Figure 27:
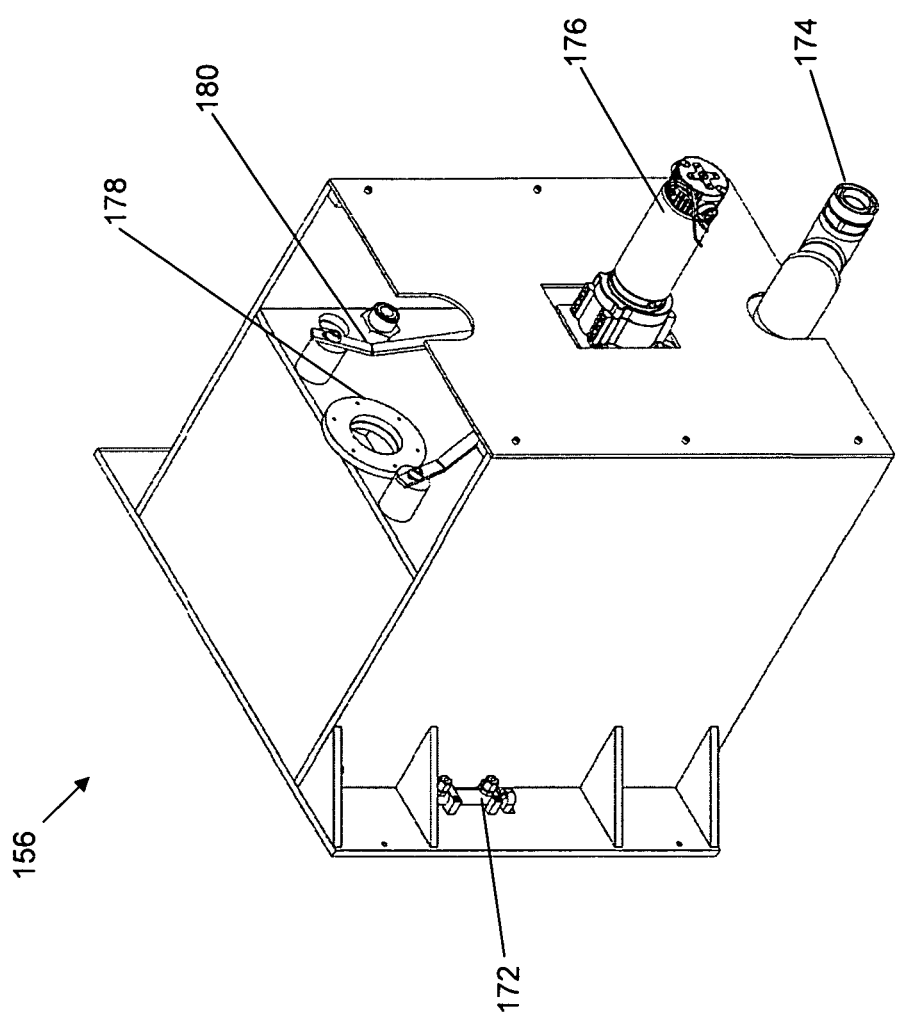
FIG. 27 is a rear perspective view illustrating the FIG. 22 embodiment.
Figure 28:
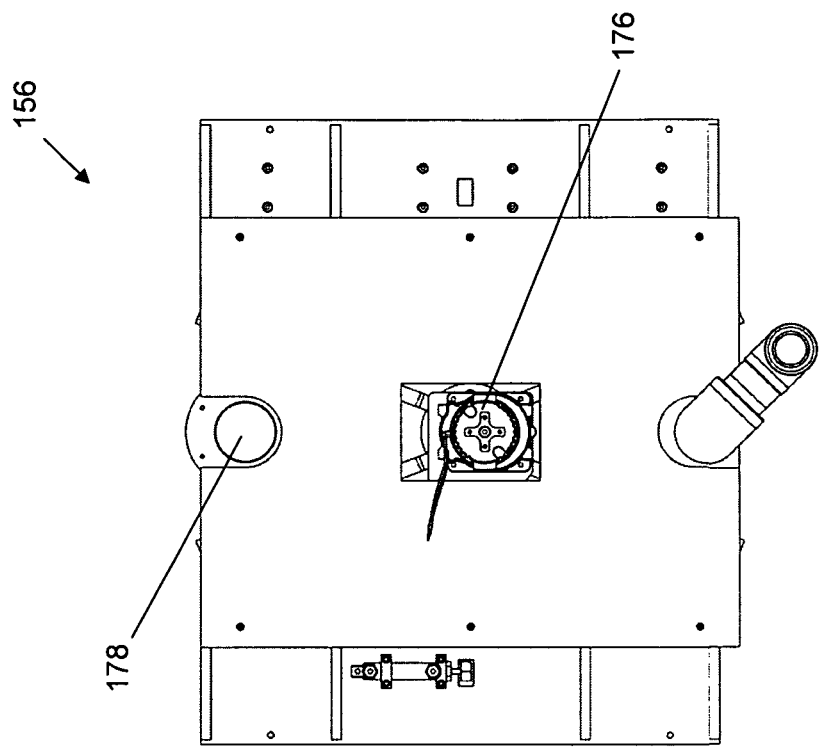
FIG. 28 is a back view illustrating the FIG. 22 embodiment.
Figure 29:
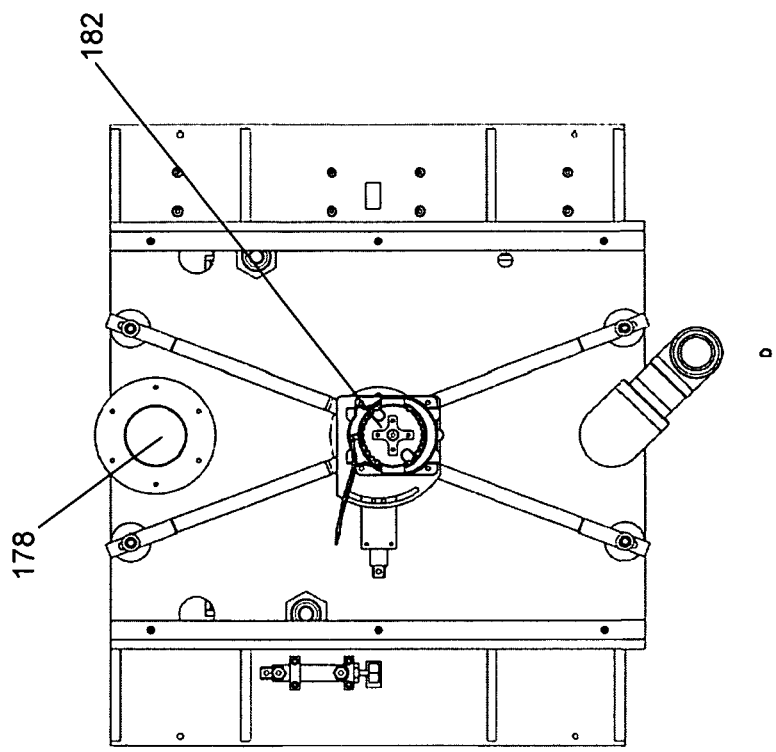
FIG. 29 is a rear view illustrating an embodiment with the rear panel removed.

FIG. 26 illustrates lid chamber 156 comprising air inlet 176 and water inlet 174. FIG. 27 illustrates lid chamber 156 with installed door lock assembly 172, butterfly valve 178 and support 180. FIG. 28 illustrates a back view of an embodiment of lid chamber 156 and FIG. 29 illustrates the back view with panel removed and showing air inlet components 182.

Figure 30:
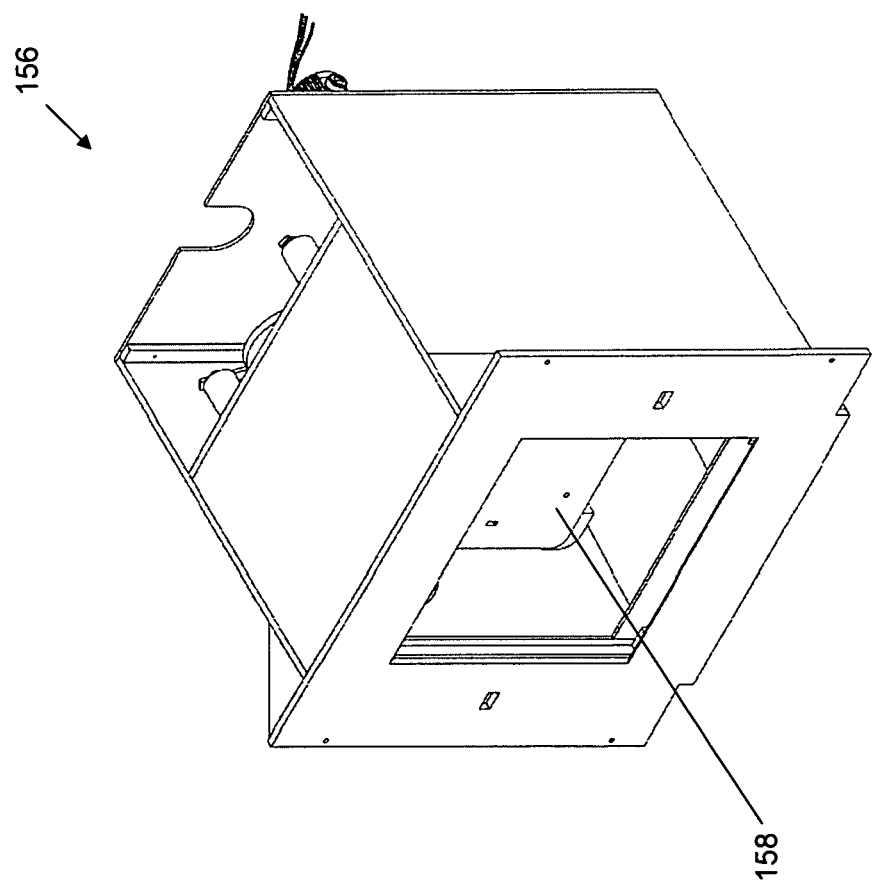
FIG. 30 is a perspective view illustrating an embodiment with the front door removed and showing a wafer carrier lid.
Figure 31:
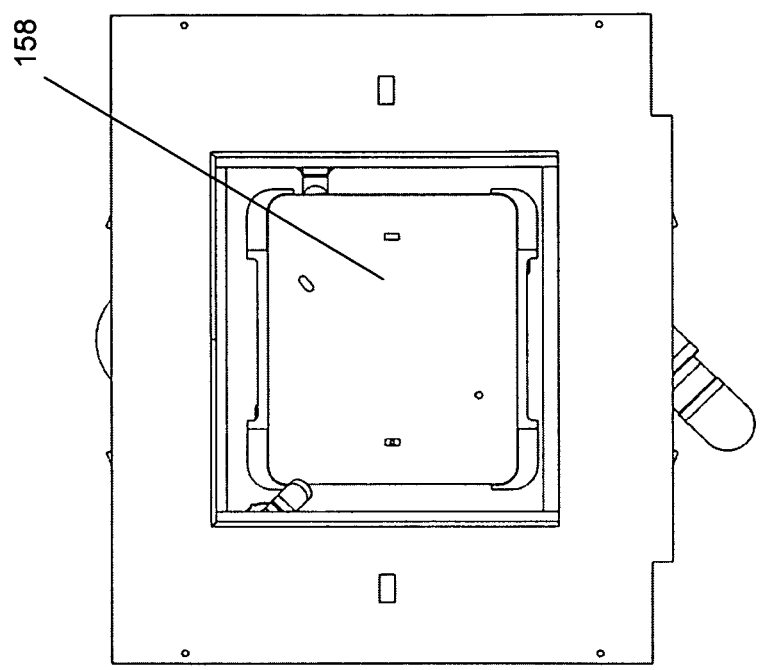
FIG. 31 is a front view illustrating an embodiment with the front door removed and showing a wafer carrier lid.
Figure 32:
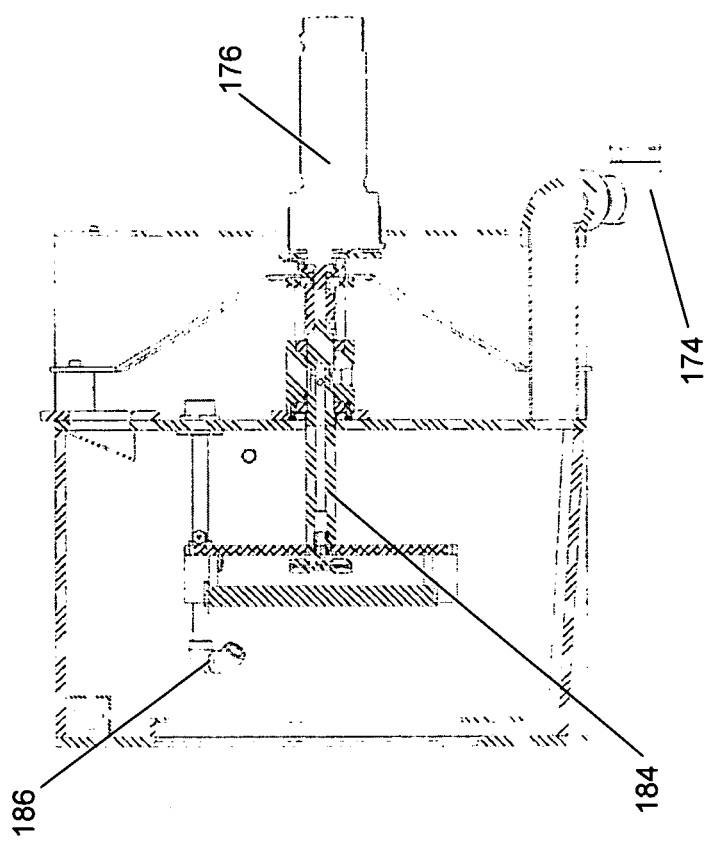
FIG. 32 is a cross section view illustrating an embodiment of a lid chamber assembly.
Figure 33:
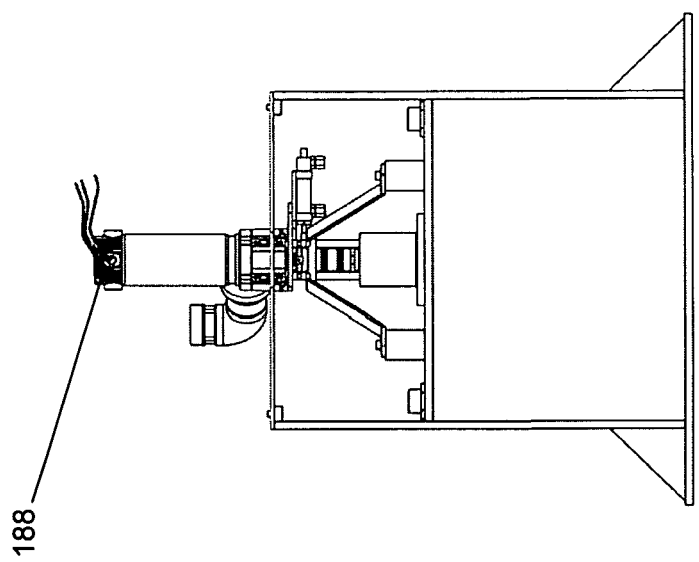
FIG. 33 is a top view illustrating an embodiment of a lid chamber assembly.
Figure 34:
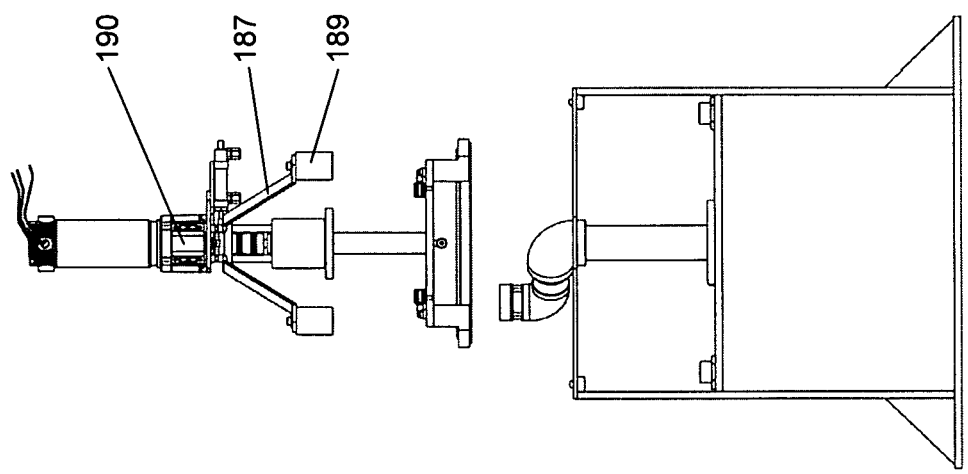
FIG. 34 is an exploded top view illustrating an embodiment of a lid chamber assembly.
Figure 35:
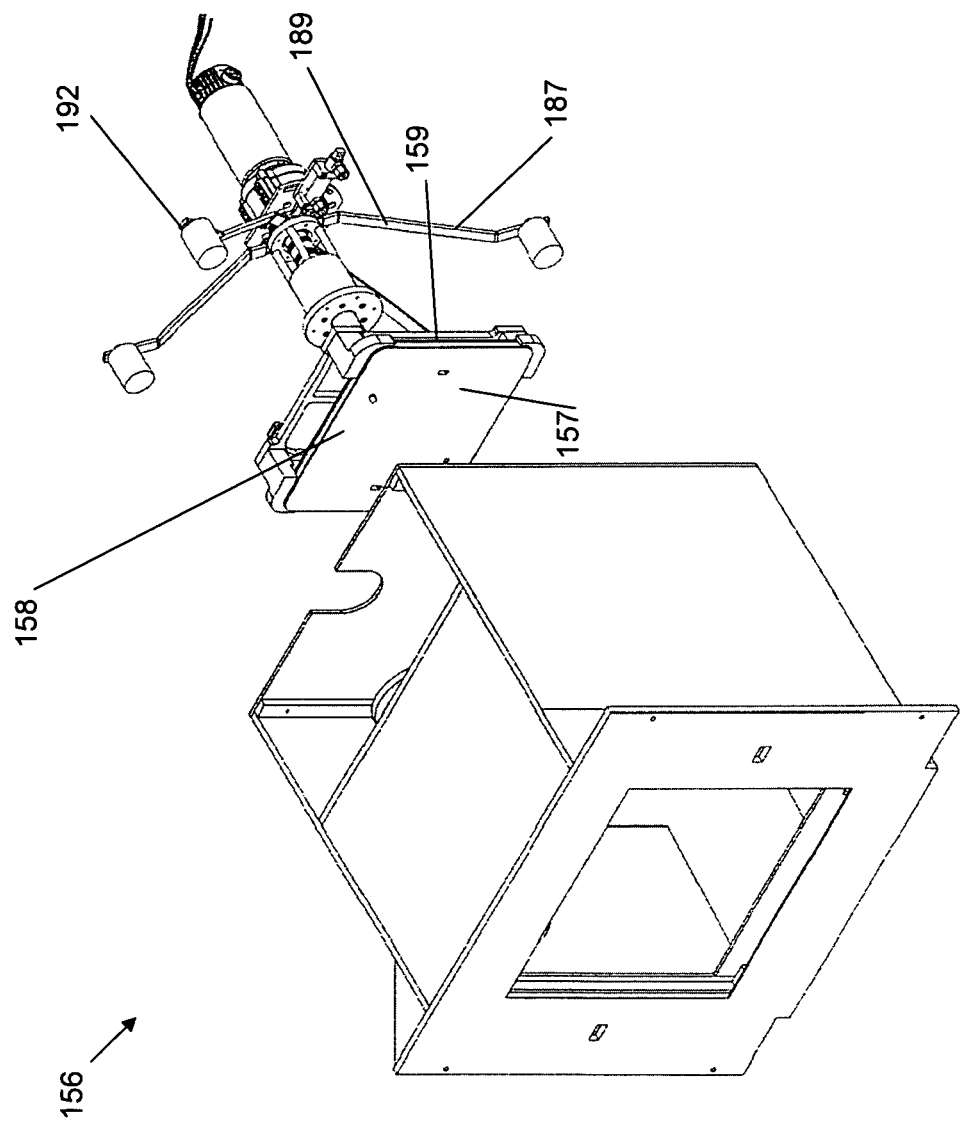
FIG. 35 is an exploded view of the components of an embodiment of a lid chamber assembly.

FIG. 30 illustrates an embodiment of lid chamber 156. Once separated from the wafer carrier body, lid 158 is placed into washing and drying chamber 156 which is outfitted with bracketed fixture 157. Bracketed fixture 157 (FIG. 35) contains a gripping apparatus used to hold lid 158 securely in place while spun during cycles. Bracketed fixture 157 is preferably powder coated aluminum and gripping apparatus 159 is preferably made entirely of Polyvinylidene fluoride (PVDF) or the like. Gripping apparatus 159 (FIG. 35) grips lid 158 which comprises a complicated structure that contains slots for lid 158 locking mechanism. When the locking mechanism is actuated it preferably opens a pathway for air to flow into the interior of lid 158. This is preferably utilized because during the wash cycle water enters the interior of the lid, trapping droplets that need to be blown out. Therefore, the bracketed fixture is preferably outfitted to be connected to motor 188 via motor shafts 184 and 190 as seen in FIGS. 32-34. The air preferably enters through a connection in the motor which connection is preferably made of Ultem where it connects to the gripping mechanism via tubes, as seen in FIGS. 33-35.

Wafer carrier lid chamber 156 can be comprised of the same material as the body chamber. In similar style to the body chamber, lid chamber 156 preferably contains four spray bars 186, 189 (see FIGS. 32-35) that wash and dry door 158 and chamber 156. Two lower spray bars 189 preferably wash and dry the lid using nozzles 187. In one embodiment, nozzles are preferably utilized in the lid chamber because the door is comprised of thin a poly-carbonate material that is easily damaged by high pressure, therefore by using nozzles the pressure can be controlled. The two upper spray bars preferably aid in the drying of the chamber walls. Similar to the body chamber, the lid chamber optionally has heating blankets directly placed on the exterior walls to keep the chamber heated and aid in the drying process.

Figure 36:
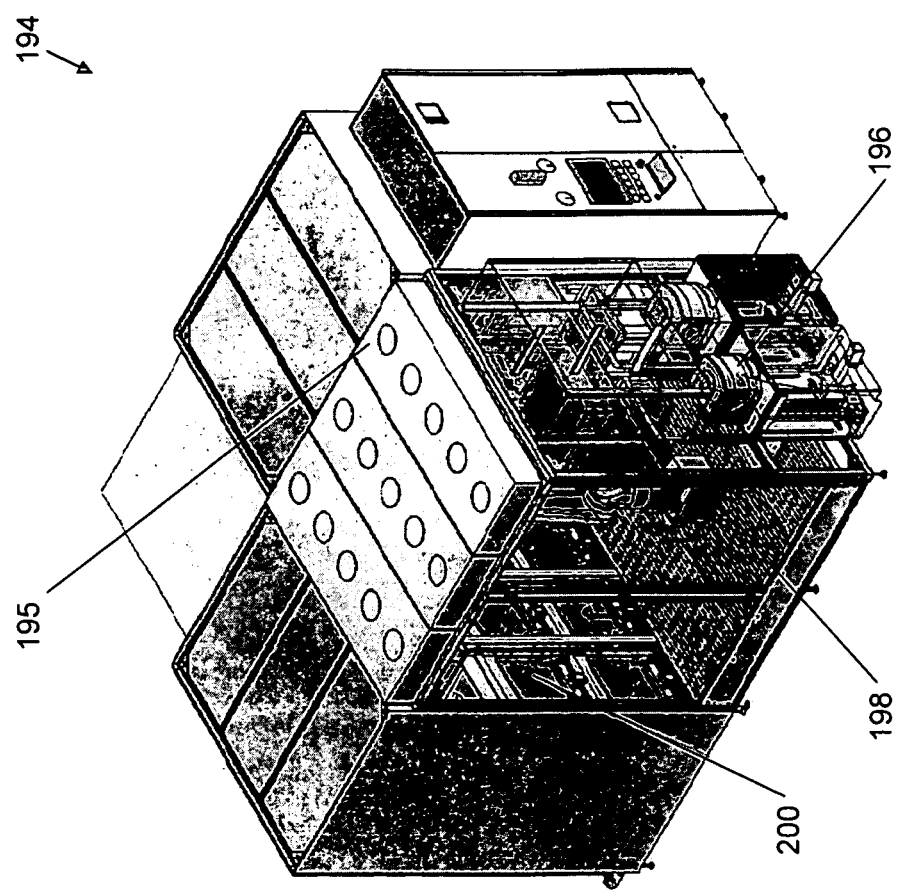
FIG. 36 is a perspective view illustrating an embodiment of a mini-environment.

FIG. 36 illustrates an embodiment of a mini-environment. In order to keep this process as clean as possible it is preferable to have a mini-environment that maintains an air particle count close to ISO standard 3 or Class 1. Mini-environment 194 preferably houses ultra-low particle air (ULPA) filters 195 that create an ultra clean laminar flow from the ceiling to the floor. The laminar flow aids in the prevention of particles coagulating underneath the grated mini-environment floor and pushes any large particles that may be attached to the wafer carrier out of the environment instead of being collected in the individual chamber. In one embodiment, the mini-environment is preferably made of about 2" by about 2" stainless steel beams that are powder coated and the floor is comprised of grated polypropylene flats. In one embodiment, the mini-environment preferably houses a six axis clean room robot 198. Robot 198 manipulates the wafer carrier bodies 196 and doors into their appropriate chambers 200 for cleaning.

The term "laminar flow" as defined throughout the specification includes but is not limited to nonturbulent flow.

Figure 37:
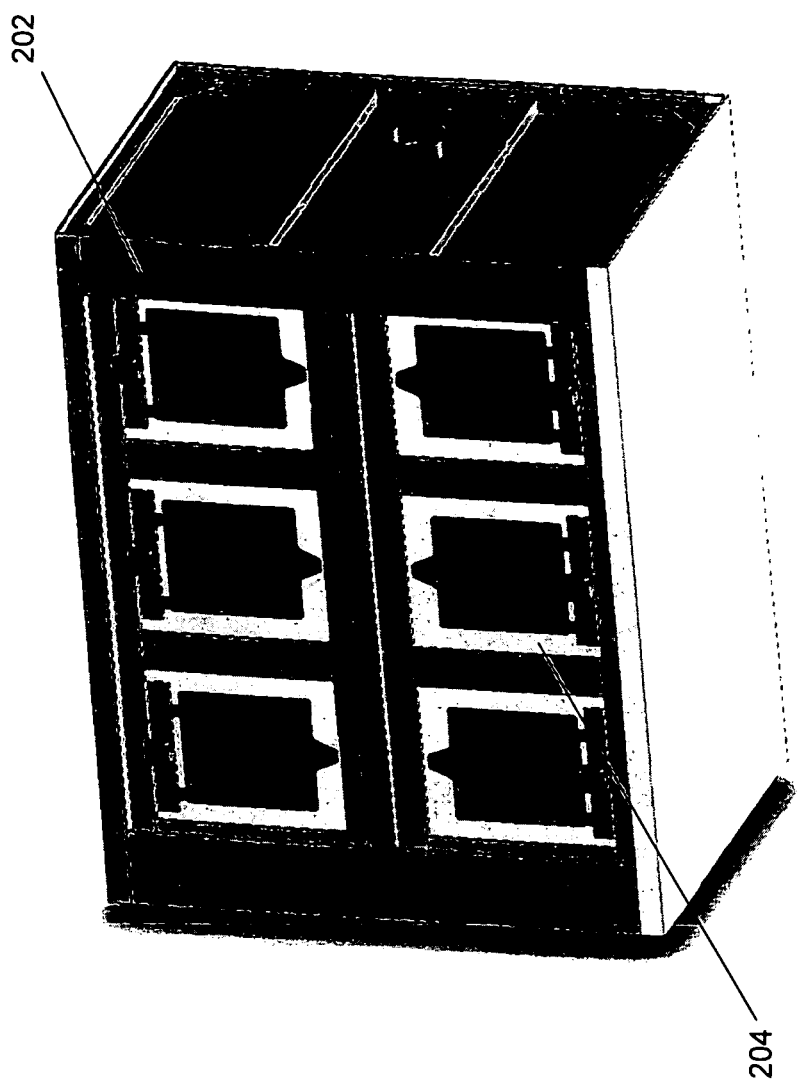
FIG. 37 is a perspective view illustrating an embodiment of a chamber cabinet of a mini-environment.
Figure 38:
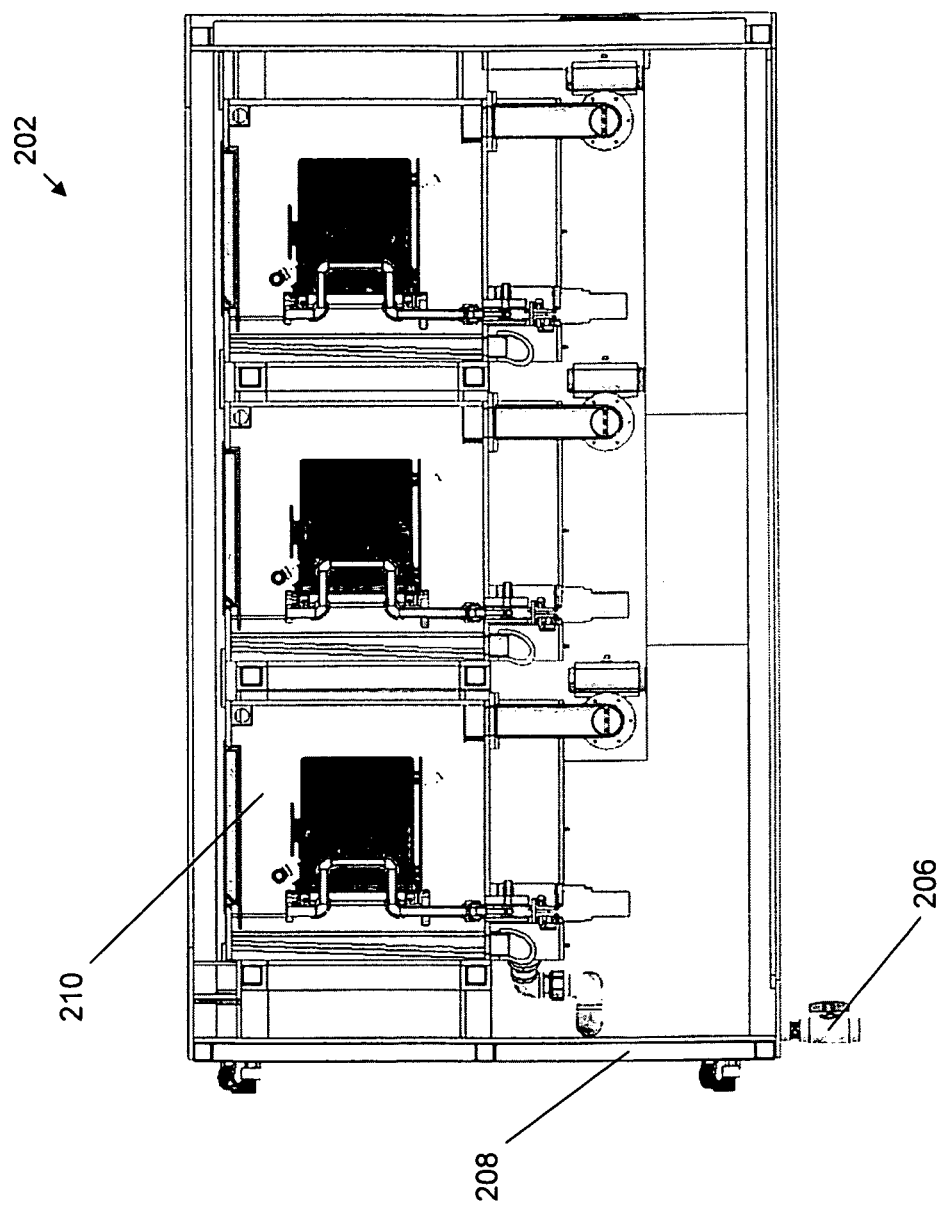
FIG. 38 is a cross-sectional view illustrating an embodiment of a chamber cabinet.
Figure 39:
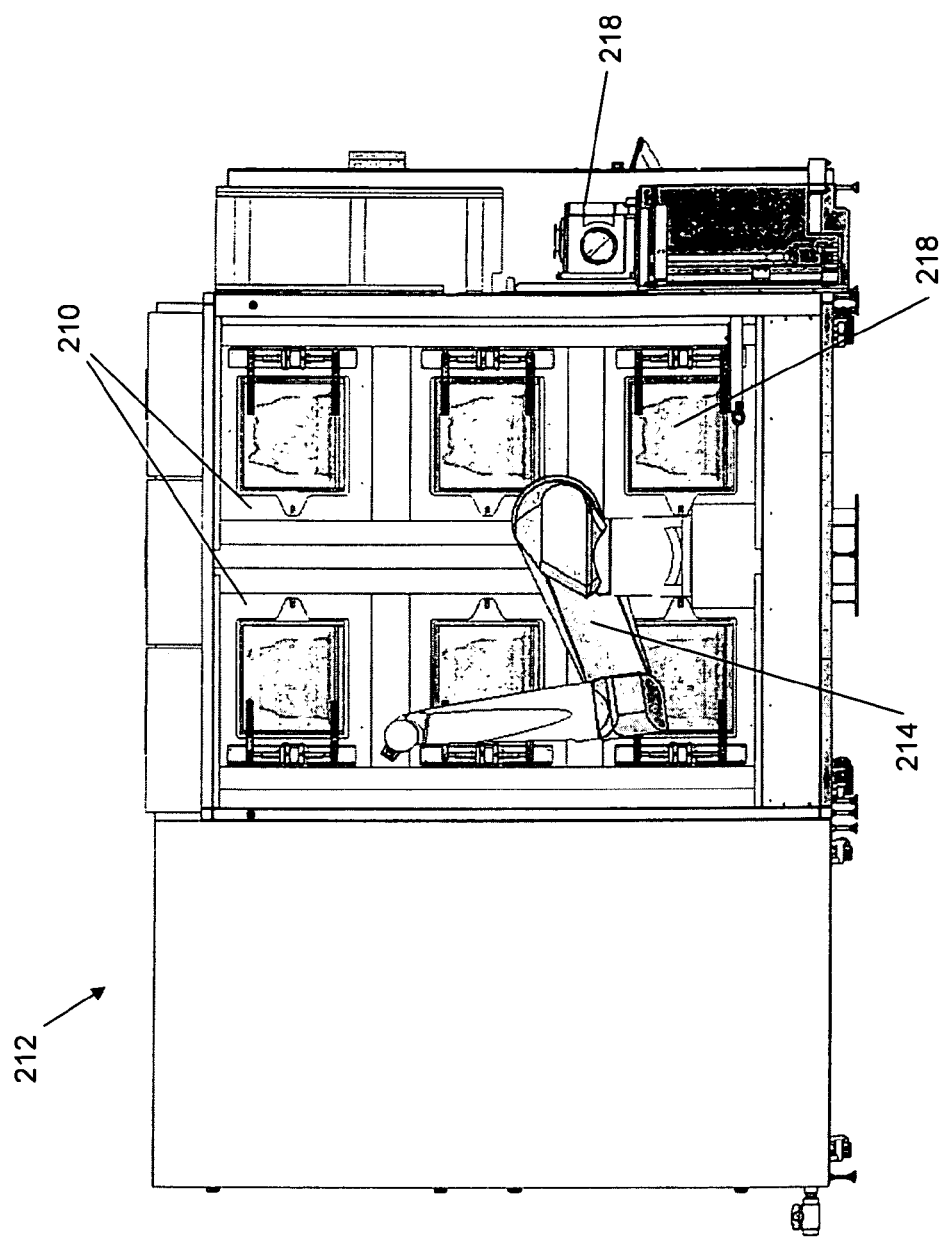
FIG. 39 is a perspective view illustrating an embodiment of a chamber cabinet in a mini-environment with a robotic arm.

FIGS. 37-39 illustrate embodiments of lid and body cabinets 202. Lid and body cabinets 202 are preferably comprised of an about two inch by about two inch 304 stainless steel frame that is preferably encapsulated entirely by Corzan G2 and/or the like. Each lid and body cabinet preferably holds about six lid and body chambers 204, respectively. The facilities enter cabinet 202 optionally through the top and come down the middle of the tool beside the exhaust duct. The cabinet is preferably fully exhausted at 206 to prevent over heating from the heating blankets and clean dry air (CDA) heaters. The cabinet preferably has grated drain 208 at the bottom of the interior face to catch any water that may leak from the chambers. In one embodiment, cabinet 202 also preferably has a drain with a leak sensor that is capable of draining all the water if all six chambers were to leak simultaneously (see FIG. 38). Alternatively, lid and body chamber cabinets can hold any number of lid and/or body chambers.

Cabinet 202 is preferably modular. FIG. 38 illustrates an embodiment of cabinet 202 where each chamber 210 is associated with a set of valves and electrical components that can be removed for maintenance and replacement. Individual chambers 210 are also preferably removable if needed for maintenance and replacement. In one embodiment, chambers 210 are preferably all the same except for the side on which the door opens, either to the left or to the right. If necessary, chambers 210 can be moved around within cabinet 202 with the change of a door direction. Optionally chambers 210 can be rotationally molded to give partially smooth corners, reducing seams and allowing for seam placement, thereby reducing the possibility of contamination. FIG. 39 illustrates a cross section of mini-environment 212 comprising robot 214, chambers 216 and wafer carrier 218.

The distribution system for the compressed gas may also utilize restricted orifices in the distributing members. The orifices are preferably combined with standardized nozzles in various sizes. The orifices are preferably sized to maintain adequate pressure and thus force, for transferring residual washing fluid away from the fixture, and promote evaporation. The distribution system members having nozzles can optionally employ various spray pattern-shaping features.

The compressed air distribution system, or a similar but separate gas distribution system, can optionally be used to cool the fixture, if required, through the use of refrigerated air, nitrogen, carbon dioxide, nitrous oxide, ammonia, or other known cooling gases but most preferably nitrogen gas. Using a dual purpose washing and drying chamber as illustrated in FIGS. 1-35, the body temperature of the fixture being dried can be cooled. By turning off heating elements and by using un-heated and/or refrigerated gas as previously described, the fixture body temperature can be cooled before removal from the drying chamber. The refrigerated, un-heated, or heated gas can be introduced into the drying chamber through a compressed gas drying distribution system, a similar but separate gas distribution system, or a purged washing fluid distribution system.

In an embodiment of the present invention, a carrier or lid that has previously been washed can be removed from a washing chamber either manually or more preferably by a robot. The fixture can also optionally be manipulated through a series of tipping, rotation, and shaking motions to remove residual washing fluid.

The carrier or lid is preferably then placed in a chamber for drying, which may be the chamber used for washing if such chamber is also at least a dual purpose chamber for drying. Or the carrier or lid may be placed in a separate drying chamber, more preferably, a dedicated drying chamber which circulates heated air. Preferably the embodiments of the present invention are fully automated. However, alternative embodiments include manual and semi-automatic embodiments.

Embodiments of the present invention can include single washing and drying chambers. Alternatively, washing and drying can be performed in separate chambers similar to those described in FIGS. 1-35. In another embodiment, the nominal washing and drying cycle duration for a wafer carrier is preferably in the range of from about five minutes to about one hour and more preferably from about ten minutes to about 40 minutes and most preferably from about 15 minutes to about 30 minutes. In one embodiment, the present invention utilizes a wafer carrier cleaning apparatus wherein the drying process duration is minimized and the efficiency of the process is increased through implementing one or more of the following alternative methods:

After the washing cycle, the wafer carrier can be robotically removed from the washing chamber and optionally a robot performs a series of manipulations of the wafer carrier, which can include tipping, rolling, jiggling and shaking, wherein residual washing fluid is removed from the wafer carrier. The rate, duration and degree of manipulation are preferably controlled by the programmed robotic commands. The wafer carrier can then be transferred to the same or a different chamber for drying, preferably by the same robot.

One possible example of such a manipulation, either manually, or by a robot, can include the following described actions in order to reduce the fixture drying duration. Although the series begins with a clockwise (CW) rotation, the direction of rotations may obviously be reversed and instead initiated with a counter-clockwise (CCW) rotation. The following describes one alternative embodiment of a drying method:

1. Open chamber door (T=0 seconds)
2. Take out wafer carrier body (T=4 seconds)
3. Rotate arm to have gripper pointing downward at approximately a 30° angle (T=5 seconds
4. Roll the wafer carrier body slowly CW to where it's inverted (approximately 180°) at about 120°/second (T=6 seconds)
5. Roll the wafer carrier body slowly approximately 360° CCW at about 120°/second (T=9 seconds)
6. Roll the wafer carrier body slowly approximately 360° CW at about 120°/second (T=12 seconds)
7. Roll the wafer carrier body slowly approximately 360° CCW at about 120°/second (T=15 seconds)
8. Jiggle the wafer carrier body to shake off any drips
9. Roll the wafer carrier body slowly CW to level at about 120°/second (T=17 seconds)
10. Rotate arm to have gripper pointing upward at approximately a 30° angle (T=18 seconds)
11. Roll the wafer carrier body slowly CW to where it's inverted (approximately 180°) at about 120°/second (T=20 seconds)
12. Roll the wafer carrier body slowly approximately 360° CCW at about 120°/second (T=23 seconds)
13. Jiggle the wafer carrier body to shake off any drips
14. Return wafer carrier body to normal, level position exterior of chamber (T=24 seconds)
15. Place wafer carrier body back in chamber and close door (T=30 seconds)

Using an alternative washing and drying chamber as illustrated in FIGS. 1-35, a typical 30 minute drying cycle can be reduced by a first application of the above described series of manipulations or other manipulations which physically remove excess liquids from the wafer carrier.

After the washing cycle, and preferably after the previously mentioned series of robotic manipulations, the wafer carrier can be placed into a dedicated drying chamber which has an initially dry interior, unlike a typical dual purpose washing and drying chamber.

Cool air or other gases are introduced into the drying chamber at selected intervals to accelerate the cool down phase of the drying cycle and to reduce the temperature of the wafer carrier.

A cam-drive or other movable system is used to oscillate the motion of the compressed air or gas distribution system along with or instead of a simple rotary motion.

Spray nozzles can be employed which control the volume, pressure, temperature and direction of the introduced compressed gas. Nozzles optionally offer greater control over plain-drilled holes for compressed gas supply requirements and greater control over pressure, volume, temperature and aiming characteristics.

In one embodiment, a wafer carrier washing and drying cycle can include separating the two parts of the wafer carrier (the body and the cassette), placing the wafer carrier into a dual washing and drying chamber (preferably robotically), washing, drying, removing the wafer carrier from the chamber, and rejoining the cassette and body pieces.

Using a direct drive motor or other system to rotate the air distribution bars, pipes, manifolds or other air distribution members can allow compressed gas to flow across the fixture being dried as well as the interior drying chamber walls.

Using an oscillating cam-drive motor system can distribute more of the compressed air to the body of the fixture being dried without blowing directly and beneficially on the walls of the chamber. An approximate 70°-110° range of reciprocating rotation can allow for efficiently directing compressed gas onto the fixture body.

One measure of a successfully dried wafer carrier can include comparing the humidity inside a sealed wafer carrier immediately after the drying cycle with the humidity inside the same wafer carrier after approximately two hours of stabilization. An increase in humidity of less than about 10% and more preferably less than about 7%, and most preferably less than about 5% can be regarded as a successfully dried wafer carrier. For example, if a wafer carrier has 31% interior humidity immediately after drying and approximately two hours later has 36% or less interior humidity, the wafer carrier is acceptably dried. If a drying process leaves visibly noticeable washing fluid inside a wafer carrier, the increase in measured humidity is typically found to be about 10% to about 22% and thus considered a failed or incomplete drying process. Externally visible washing fluid droplets are also grounds for rejecting a drying process and indicate the need for additional gas nozzles or other methods.

The compressed gas distribution members may have orifices enlarged by increasing the drilled diameters. Increasing an orifice diameter can increase the volume of gas delivered to the fixture body, but without gas supply changes, and depending upon initial supply configurations, such modification can reduce the gas flow velocity, thereby reducing the efficiency of the drying system and thus increasing the drying duration. For example, by doubling the diameter of the drying bar holes directed at the exterior of a fixture, from about $1/32$ of an inch in diameter to about $1/16$ of an inch in diameter and increasing the fixture interior drying member orifices from about $1/16$ of an inch in diameter to about $3/32$ of an inch in diameter, increases the required drying time compared to the drying time resulting from the smaller dimensions.

For a combined washing and drying chamber, the exterior surface (upper) wash spray bar is preferably purged to prevent liquid from dripping onto the wafer carrier. A shortened length of piping between the valve and the spray bar can also help reduce the amount of liquid that can drip onto the wafer carrier following a cleaning process. The interior and exterior surfaces of a wafer carrier body can preferably be washed at the same time, thus saving about 1 to 1½ minutes. As one possible example, a wash cycle using a carousel system can have an approximate two minute interior wash followed by an approximate one minute exterior wash.

Cooling down the drying chamber quickly can lessen humidity in the chamber at a post-processing humidity measurement. With a single unit non-carouseled chamber, the wafer carrier body holder need not be wall-mounted. Thus, expensive coated machined parts are preferably replaced by simpler and cheaper wafer carrier body holders.

An approximate 12 second delay can be introduced after washing and before the wafer carrier is removed from the cleaning chamber. This allows the inner spray bar to settle into its rest position. Some specific models of wafer carrier's can benefit from one or more gas nozzles directed along the lower front ridge of the body to remove accumulated drips.

Preheating the wafer carrier can increase process reliability. This can include washing with hot water and/or venting heated gas onto the dirty wafer carrier bodies as they are awaiting processing. A flexible shaft coupler can reduce motor problems.

Similar to enlarging orifice diameters, enlarging holes in drying bars, without other changes and depending upon initial supply configurations, can reduce the effectiveness of drying a wafer carrier body by decreasing the velocity and thus the force of the gas delivered from distribution member orifices. Controlling orifice size by employing standard nozzles is preferable to plain holes drilled in the distribution members.

Pre-heating a wafer carrier using one or more hot fluids, particularly those that are gases, or those which readily evaporate, before the drying process is started, reduces the drying process duration. For example, if heated water is used to warm the wafer carrier during the wash cycle, it increases the likelihood the wafer carrier body can be properly dried compared to washing with room-temperature water.

Cooling the drying chamber and/or the wafer carrier body, has a measurable effect on the post-processing humidity results. Where passing the drying cycle is important, a cooling method may improve drying results. A dry wafer carrier body that is barely warm to the touch will normally pass a two-hour post-processing humidity test.

Reheating the wafer carrier drying chamber after a drying cycle cool down is complete is typically beneficial. The wafer carrier drying chamber is often at a temperature of about 30°-35° C. after use. In order for the chamber to quickly reheat before the next cycle is begun, turning off the pulling gas improves the chamber heating time. For example, instead of taking approximately 8-10 minutes to heat a chamber, shutting off the pulling gas can reduce the reheating time to approximately 5-6 minutes.

Chamber size can effect drying time. Independent of whether the chamber has separate or common wash and dry cycles, a smaller chamber has less volume and if provided with a same amount of power as a larger chamber, the smaller chamber can increase the likelihood that drying will be quicker. The tighter confines of a smaller chamber can also force air to flow closer to the surfaces of the wafer carrier body. Another advantage of a smaller chamber size is that a smaller footprint may be desirable for vendors that need a production version of such tool.

The wafer carrier holding features can be a source for entrapment of undesirable residual washing liquid and can be addressed by design improvements. A few of the possible overall design improvements includes but is not limited to:
1) Making the wafer carrier holder out of plastic instead of a machined and specialty-coated aluminum structure.
2) Making the wafer carrier holder feet similar to the single wafer carrier test cell feet can reduce a potential source for entrapment of moisture in the wafer carrier. This improvement can be combined with other wafer carrier body holding system improvements.
3) Dried units are preferably subject to visual inspection for washing fluid droplets as well as the follow-on humidity test. In one embodiment, any washing fluid droplets in the interior of the wafer carrier body are considered as failures where the visibly-noticeable fluid typically increases the humidity upwards of about 10%.

Alternative embodiments of the present invention include but are not limited to using a dedicated drying chamber or ensuring the interior of a dual purpose washing and drying chamber is dry before placement of the fixture to be dried into the chamber, can reduce the drying cycle duration. Eliminating the washing fluid from the walls of the chamber before its use as a drying chamber increases the efficiency of the drying process. Eliminating the excess liquids from the interior surfaces of the chamber allows for improved drying conditions for the fixture. Reducing the dimensions of a dual purpose chamber can also reduce the amount of possible fluid-covered area and improve drying efficiency. Furthermore, reducing the dimensions of a drying chamber can increase gas circulation velocities, thereby improving efficiency.

INDUSTRIAL APPLICABILITY

The invention is further illustrated by the following non-limiting examples. The following examples include a wash cycle followed by a drying cycle, with a wafer carrier and wafer carrier lid installed in chamber similar to those illustrated in FIGS. 1-35. Additionally a chamber cabinet and mini-environment has been constructed similar to those illustrated in FIGS. 36-39.

Example 1

A body chamber was made and was comprised of Polyvinyldiene fluoride (PVDF) sheets with the dimensions of 25.5 inches deep by 21 inches wide and 26 inches high. The body chamber had a side opening door and pulley driven drive for the exterior spray bar on the right side of the chamber. The body chamber also had an interior spray bar that was directly driven. The wafer carrier body sat on a frame that allowed for the interior to be cleaned by the interior spray bar. The corner supports were slightly angled to prevent water collection and particle coagulation. All exposed sides of the frame were chamfered at the top to prevent water collection and particle coagulation as well. The exterior spray bar comprised slots 0.010 inches wide by 0.080 inches long that were positioned along the sides of the pipe facing the wafer carrier body and chamber walls. The slots were created using a laser and acted as water nozzles during the wash cycle and as fanning air nozzles during the air knife and dry cycles. The interior spray bar comprised 0.03125 inch and 0.0625 inch holes and two fanning water nozzles that covered the interior of the wafer carrier body.

The pulley drive connected to the exterior spray bar manifold which also comprised the inlet connections for the air and water. This was an important aspect of the body chamber because it aided in the prevention of misalignment of the spray bar due to pressure changes and expansion and contraction of the piping material (which is PVDF). Another important aspect of the body chamber was the butterfly exhaust valve that controlled the pressure inside the chamber. During the wash cycle it was not as important to have a large pressure relief as during the air knife cycle, due to the high pressure and volume of air. The butterfly valve was actuated via air to open then the pressure was released to close. The design of the diaphragm allowed for a minimal amount of exhaust to be pulled when closed.

The body chamber exterior spray bar was a unique apparatus. The exterior spray bar was comprised of numerous parts all made of PVDF and Teflon. The manifold connected the pulley drive, air and water inlet, and spray bar together. Three large holes allowed for air and water to flow into the spray bar without creating pressure from the rotation. The holding brackets were welded onto the pipe and prevented interference of the slots so that there was full contact of air and water to the carrier body. The driving side of the pulley drive utilized limit switches to prevent the exterior spray bar from over rotating and damaging the pipe. The exterior spray bar rotated approximately 270° from back to front and front to back in a sweeping motion.

The body chamber interior spray bar was constructed as a direct drive that also used limit switches. The interior spray bar was a simple fusion welded pipe and elbows that were drilled with the smaller hole sizes on the top and larger hole sizes on the sides. The spray bar freely rotated in a hole in the front skirt of the base frame. The interior spray bar rotated in a sweeping motion at approximately 180° from side to side, perpendicular to the exterior spray bar. The two different sweeping motions were used so that the wafer carrier was not pushed one way or the other. Movement by the wafer carrier body was also prevented with the use of the corner supports in which tabs on both sides kept the wafer carrier in position. Capacitive sensors were implemented to aid in the detection of movement. The sensors were extremely close but not touching the carrier to detect if the carrier became displaced from the corner supports. If this happened, damage could occur not only to the wafer carrier body but also to the interior and exterior spray bars.

In order to have the wafer carrier bodies dry within the allotted time, it was necessary to keep the chamber as warm as possible. The wafer carriers had a coating on the polycarbonate that aided in the prevention of damage to carrier during transportation and use that cannot be heated above 60° C. (140° F.). Otherwise, warping would occur. Therefore, to maintain the heat needed at a reasonable temperature heating blankets were added to the exterior of the chamber. These blankets were set at 180° F. and heated the chamber to about 160° F. An infrared sensor on the side of the chamber monitored the temperature of the wafer carrier closest to the top where the carrier may become the hottest. The heating of the chamber became critical after the wash cycle during the purge and air knife cycle, where the temperature of the wafer carrier and chamber dropped drastically. Therefore, by having the dry cycle heated, it returned to the desired interior temperature of the chamber, maintaining the allotted process time. The process for cleaning the wafer carrier bodies were as follows:

10. Body chamber door opened (T=0)
11. Robot placed wafer carrier body onto frame (T=40 seconds)
12. Body chamber door closed and locked (T=60 seconds)
13. Wash cycle (T=61 seconds)
14. Purge cycle (T=121 seconds)
15. Air Knife cycle (T=131 seconds)
16. Heated CDA Dry cycle (T=371 seconds)
17. Spray bars returned to home position (T=731 seconds)
18. Body chamber door opened (T=732 seconds)

From load port to load port, the total process time was 14 minutes with a cleaning process time of 12 minutes. With this process cycle, an output of 21 wafer carriers per hour at start up and 25 wafer carriers per hour continuously was met.

Mini-Environment:

In order to keep this process as clean as possible it was necessary to have a mini-environment that maintained an air particle count close to ISO standard 3 or Class 1. The mini-environment housed ultra-low particle air (ULPA) filters that created an ultra clean laminar flow from the ceiling to the floor. The laminar flow aided in the prevention of particles coagulating underneath the grated mini-environment floor and pushed any large particles that may have been attached to the wafer carrier out of the environment instead of being collected in the individual chamber. The mini-environment was made of 2" by 2" stainless steel beams that were powder coated and the floor was comprised of grated polypropylene flats. The mini-environment housed a six axis clean room robot by Staubli. This robot manipulated the wafer carrier bodies and doors into their appropriate chambers for cleaning.

Lid and Body Cabinets:

The lid and body cabinets were comprised of a two inch by two inch 304 stainless steel frame that were encapsulated entirely by Corzan G2. For each cabinet, the dimensions were 108 inches tall by 60 inches deep by 82.5 inches wide. Each lid and body cabinet held six lid and body chambers, respectively. The facilities entered the cabinet through the top and down the middle of the tool beside the exhaust duct. The cabinet was fully exhausted to prevent over heating from the heating blankets and clean dry air (CDA) heaters. The cabinet had a grated drain at the bottom of the interior face to catch any water that may have leaked from the chambers. The cabinet also had a drain with a leak sensor that was capable of draining all the water if all six chambers were to leak simultaneously.

Each chamber was associated with a set of valves and electrical that could be removed for maintenance and replacement. The individual chambers were also removable if needed for maintenance and replacement. The body chambers were all the same except for the side the door opens, either to the left or to the right, as shown in the cabinet drawings. This was the same for all the lid chambers as well. Therefore, if necessary, the chambers could be moved around within the cabinet with the change of a door direction.

Separate washing and drying chambers versus combined chamber:

In one experiment, using a dual purpose washing and drying chamber as illustrated in FIG. 2 and preheated to a temperature of about 135° F. (57° C.), a series of manipulations, as previously described, was performed manually. The total reduction in over-all drying time was found to be about 4 minutes. Preheating the chamber reduced residual fluid from the chamber walls, prior to the insertion of the wafer carrier.

Example 2

In-Chamber Cooling Gas Supplied During the Drying Process

It was found that turning off chamber heat sources dropped the temperature of the chamber by nearly 10° C. in the first minute but with diminishing effects thereafter. Delivering the cooling gas simultaneously to the exterior and the interior of the fixture body, lowered the fixture body temperature rapidly. ¼ inch nozzles and two 18 inch air knives, emitting clean dry air at approximately room temperature, were used and were found to cool a wafer carrier in approximately two minutes.

The preceding examples can be repeated with similar success by substituting the generically or specifically described components and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus for washing and drying a carrier, the apparatus comprising:
    a chamber comprising top, bottom and side walls and a door located on one of said side walls; said chamber capable of holding a single carrier;
    said chamber comprising a carrier-exterior spray system and a carrier-interior spray system internal to said chamber;
    said carrier-exterior spray system comprising at least one slot which sprays a fluid onto an exterior surface of the carrier; and
    said carrier-interior spray system comprising at least one slot which sprays the fluid into an interior of the carrier;
    said apparatus further comprises at least one heating system which heats one or more walls of said chamber, said at least one heating system comprising at least one heating blanket within said one or more walls of the chamber or on said one or more walls exterior to the chamber or combinations thereof; and
    temperature sensor that monitors the temperature of the carrier.

2. The apparatus of claim 1 wherein said chamber is capable of holding a semi-conductor wafer carrier.

3. The apparatus of claim 1 wherein said chamber is capable of holding a carrier lid.

4. The apparatus of claim 1 wherein said spray systems move perpendicular to each other to prevent carrier movement, and further wherein said carrier-exterior spray system further comprises a spray bar and said carrier-interior spray system further comprises a spray bar.

5. The apparatus of claim 1 wherein said spray systems oscillate in a sweeping motion.

6. The apparatus of claim 1 further comprising a motor for rotating the carrier.

7. The apparatus of claim 1 wherein said apparatus is disposed within a mini clean environment comprising one or more ultra-low particle air filters.

8. The apparatus of claim 7 wherein a plurality of apparatuses are disposed within a cabinet.

9. The apparatus of claim 1 wherein said carrier-exterior spray system is at least partially rotatable.

10. The apparatus of claim 1 wherein said carrier-interior spray system is at least partially rotatable.

11. The apparatus of claim 1 wherein said chamber further comprises an air pressure vent valve.

12. The apparatus of claim 11 wherein said vent valve is a butterfly valve.

13. The apparatus of claim 1 wherein said carrier-exterior spray system comprises a spray bar, manifold and air and water inlets.

14. The apparatus of claim 13 wherein said carrier-exterior spray system further comprises a pulley drive.

15. The apparatus of claim 1 wherein said temperature sensor is an infrared sensor.

16. A method of washing and drying a carrier, the method comprising:
    disposing a single carrier into a chamber; said chamber comprising top, bottom and side walls and a door located on one of said side walls;
    spraying a liquid on an exterior of the carrier with an exterior spray system;
    spraying a liquid on an interior of the carrier with an interior spray system;
    spraying a gas on an exterior of the carrier with the exterior spray system;
    praying a gas on an interior of a carrier with the interior spray system;
    heating said chamber by at least one heating system which heats one or more walls of said chamber wherein said at least one heating system comprises at least one heating blanket within said one or more walls of the chamber or on said one or more walls exterior to said chamber or combinations thereof; and
    monitoring the temperature of the carrier with a temperature sensor.

17. The method of claim 16 wherein disposing a carrier comprises disposing a semi-conductor wafer carrier.

18. The method of claim 16 wherein disposing a carrier comprises disposing a carrier lid.

19. The method of claim 16 further comprising heating an exterior of the chamber.

20. The method of claim 16 wherein the exterior and interior of the carrier are sprayed in a perpendicular motion to one another.

21. The method of claim 16 wherein at least one of the spraying steps comprises spraying in a sweeping motion.

* * * * *